United States Patent
Jha et al.

(10) Patent No.: US 10,553,793 B2
(45) Date of Patent: *Feb. 4, 2020

(54) SYSTEMS AND METHODS FOR GATED-INSULATOR RECONFIGURABLE NON-VOLATILE MEMORY DEVICES

(71) Applicant: University of Cincinnati, Cincinnati, OH (US)

(72) Inventors: Rashmi Jha, Wyoming, OH (US); Andrew Rush, Cincinnati, OH (US); Eric Herrmann, Beavercreek, OH (US)

(73) Assignee: University of Cincinnati, Cincinnati, OH (US)

(*) Notice: Subject to any disclaimer, the term of this patent is extended or adjusted under 35 U.S.C. 154(b) by 0 days.

This patent is subject to a terminal disclaimer.

(21) Appl. No.: 16/367,637

(22) Filed: Mar. 28, 2019

(65) Prior Publication Data

US 2019/0305220 A1    Oct. 3, 2019

Related U.S. Application Data

(60) Provisional application No. 62/649,150, filed on Mar. 28, 2018.

(51) Int. Cl.
| | |
|---|---|
| G11C 5/14 | (2006.01) |
| H01L 45/00 | (2006.01) |
| H01L 27/24 | (2006.01) |
| G11C 13/00 | (2006.01) |

(52) U.S. Cl.
CPC .......... *H01L 45/146* (2013.01); *G11C 13/004* (2013.01); *G11C 13/0069* (2013.01); *H01L 27/2436* (2013.01); *H01L 27/2463* (2013.01); *H01L 45/1206* (2013.01); *H01L 45/1253* (2013.01); *H01L 45/1625* (2013.01); *H01L 45/1675* (2013.01); *G11C 2013/0045* (2013.01); *G11C 2013/0078* (2013.01)

(58) Field of Classification Search
CPC .............. G11C 13/004; G11C 13/0069; G11C 2013/0045; G11C 2013/0078; H01L 45/146; H01L 27/2436; H01L 27/2463; H01L 45/1206; H01L 45/1253; H01L 45/1625; H01L 45/1675

See application file for complete search history.

(56) References Cited

U.S. PATENT DOCUMENTS

| | | | |
|---|---|---|---|
| 4,839,700 A | 6/1989 | Ramesham et al. | |
| 7,535,746 B2* | 5/2009 | Kawazoe | G11C 13/0007 365/148 |
| 7,763,880 B2 | 7/2010 | Williams | |

(Continued)

OTHER PUBLICATIONS

U.S. Appl. No. 16/367,632, filed Mar. 2018, Jha et al.*

(Continued)

*Primary Examiner* — Pho M Luu
(74) *Attorney, Agent, or Firm* — Dinsmore & Shohl LLP

(57) ABSTRACT

Systems and methods of use and fabrication are described for a non-volatile resistive random access memory (RRAM) multi-terminal device including a first electrode, a second electrode, a metal oxide disposed between the first electrode and the second electrode, and an at least first gate configured to apply a voltage bias to change a resistive state in the metal oxide.

20 Claims, 14 Drawing Sheets

(56) References Cited

U.S. PATENT DOCUMENTS

| | | | |
|---|---|---|---|
| 8,551,809 B2* | 10/2013 | Kumar | H01L 45/08 257/4 |
| 9,269,042 B2 | 2/2016 | Friedman et al. | |
| 9,818,057 B2 | 11/2017 | Nishitani et al. | |
| 10,297,750 B1* | 5/2019 | Ando | H01L 27/108 |
| 2011/0024714 A1 | 2/2011 | Wu et al. | |
| 2011/0240946 A1 | 10/2011 | Miao et al. | |
| 2014/0117304 A1 | 5/2014 | Park | |
| 2016/0248007 A1 | 8/2016 | Hersam et al. | |
| 2017/0317142 A1 | 11/2017 | Bedau | |
| 2019/0198759 A1 | 6/2019 | Hong et al. | |

OTHER PUBLICATIONS

Vinod K. Sangwan, et al. "Gate-tunable memristive phenomena mediated by grain boundaries in single-layer MoS2" Apr. 6, 2015; https://www.nature.com/articles/nnano.2015.56.

Vinod K. Sangwan, et al. Multi-terminal memtransistors from polycrystalline monolayer molybdenum disulfide:, Feb. 21, 2018 ; https://www.nature.com/articles/nature25747.

Vinod K. Sangwan, et al. "Gate-tunable memristors from monolayer MoS2", Feb. 21, 2018; https://arxiv.org/ftp/arxiv/papers/1802/1802.07785.pdf.

Mohammed Affan Zidan, et al, "Compensated Readout for High-Density MOS-Gated Memristor Crossbar Array", Jan. 1, 2015; https://ieeexplore.ieee.org/document/6933920/.

Hongwei Tan, et al. "Light-Gated Memristor with Integrated Logic and Memory Functions," Oct. 13, 2017; https://patents.google.com/scholar/11913949130271842729?q=memristor&q=3-terminal,gate-controlled,gated,three-terminal&scholar.

Mohammed Affan Zidana, et al, "Memristor-based Memory: The Sneak Paths Problem and Solutions", Feb. 1, 2013, https://www.researchgate.net/profile/Khaled_Salama/publication/256815048_Memristor-based_memory_The_sneak_paths_problem_and_solutions/links/5a0e94f5a6fdcc2b5b5dffc1/Memristor-based-memory-The-sneak-paths-problem-and-solutions.pdf.

Qiangfei Xia et al., "Two- and Three-Terminal Resistive Switches: Nanometer-Scale Memristors and Memistors", May 11, 2019; https://onlinelibrary.wiley.com/doi/pdf/10.1002/adfm.201100180.

Zhi Zhou, et al. "Biologically-inspired learning device using three-terminal ferroelectric memristor", Jun. 18, 2018; https://ieeexplore.ieee.org/document/6256971/.

Premlad Balakrishna Pillai, "Nanoionics-Based Three-Terminal Synaptic Device Using Zinc Oxide ", Dec. 16, 2019; https://pubs.acs.org/doi/abs/10.1021/acsami.6b13746.

Office Action dated Aug. 13, 2019 relating to the U.S. Appl. No. 16/367,632.

Herrmann, E., et al. "Gate Controlled Three-Terminal Metal Oxide Memristor." IEEE Electron Device Letters. vol. 39 No. 3, Date of publication Feb. 14, 2018 (Feb. 14, 2018) [online] <URL: https://ieeexplore.ieee.org/abstract/document/8291584>.

International Search Report and Written Opinion dated Jun. 10, 2019 for PCT/US2019/24528 Filed Mar. 28, 2019. pp. 1-13.

International Search Report and Written Opinion dated Jun. 10, 2019 for PCT/US2019/24525 Filed Mar. 28, 2019. pp. 1-12.

* cited by examiner

SYSTEMS AND METHODS FOR GATED-INSULATOR RECONFIGURABLE NON-VOLATILE MEMORY DEVICES

CROSS-REFERENCE TO RELATED APPLICATIONS

This application claims the benefit of U.S. Provisional Application Ser. No. 62/649,150 (CIN 0264 MA), filed Mar. 28, 2018, the entirety of which is incorporated by reference herein.

STATEMENT REGARDING FEDERALLY SPONSORED RESEARCH OR DEVELOPMENT

This invention was made with government support under ECCS 1556294 and CNS 1556301 awarded by the National Science Foundation. The government has certain rights in the invention.

TECHNICAL FIELD

This present disclosure relates to non-volatile memory (NVM) devices and, more particularly, to reconfigurable and tunable resistive random access memory (RRAM) memristive devices for NVM applications.

BACKGROUND

Semiconductor chip technology is a basis for memory devices. Such memory devices include volatile memory devices and non-volatile memory devices. Volatile memory devices are dependent on power to maintain stored information, and non-volatile memory devices by contrast maintain stored information independent of power. Semiconductor manufacturers continually use processing technologies to attempt to increase an amount of chips on a semiconductor wafer while reducing chip cost and power consumption. A need exists for alternative non-volatile memory devices that are cost-effective to manufacture and minimize power consumption.

BRIEF SUMMARY

According to the subject matter of the present disclosure, a method of switching a resistive state in a non-volatile multi-terminal resistive random access memory (RRAM) device may include applying a voltage bias with an at least first gate of the non-volatile multi-terminal RRAM device, the non-volatile multi-terminal RRAM device further including a first electrode, a second electrode, and a metal oxide defining a conduction path positioned between the first electrode and the second electrode, and based on a polarity of the voltage bias applied, switching the resistive state in the conductance path between a low resistance state (LRS) and a high resistance state (HRS) in the conduction path.

In accordance with one embodiment of the present disclosure, a method of integrating one or more non-volatile multi-terminal resistive random access memory (RRAM) devices into a crossbar array for a neuromorphic application may include positioning at least one non-volatile multi-terminal RRAM device as a crosspoint device between an input bar and an output bar of the crossbar array, wherein at least one non-volatile multi-terminal RRAM device comprises a top electrode, a bottom electrode, a metal oxide defining a conduction path disposed therebetween, and an at least first gate configured to apply a voltage bias to change a resistive state based on movement of oxygen ions in the conduction path to switch the resistive state between the first electrode and the second electrode between a low resistance state (LRS) and a high resistance state (HRS). The method may further include integrating a pre-neuron device into the input bar of the crossbar array and integrating a post-neuron device into the output bar of the crossbar array. The resistance state of the at least one non-volatile multi-terminal RRAM device may be configured to affect behavior of post-neuron device.

In accordance with another embodiment of the present disclosure, a method of fabricating a non-volatile multi-terminal resistive random access memory (RRAM) device may include sequentially depositing an amount of material for a second electrode, an amount of material for a first insulator layer, and an amount of material for a first electrode onto a semiconductor substrate material through a deposition technique to form a wafer, applying a removal technique to remove one or more top layers from the wafer, wherein a protected top layer of the first electrode comprises a top electrode and an underlying exposed layer of the second electrode comprises a bottom electrode, and applying the removal technique on an edge of the top electrode to expose underlying semiconductor substrate material and define an etched region on a sidewall of the wafer. The method may further include sequentially depositing an amount of material for a metal oxide, an amount of material for a gate insulator layer, and an amount of material for a gate for the non-volatile multi-terminal RRAM device through the deposition technique, and applying the removal technique to an area outside of the etched region such that a sidewall of the etched region is designated as an active area for a conduction path of the non-volatile multi-terminal RRAM device.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
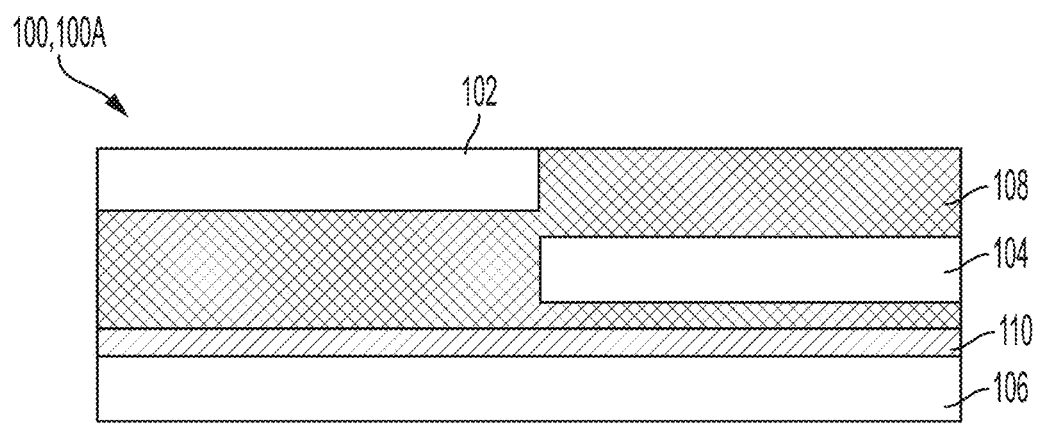
FIG. 1 is a schematic illustration of a cross-sectional view of a multi-terminal resistive random access memory (RRAM) device as a three-terminal (3T) RRAM device, according to one or more embodiments as shown and described herein.
Figure 2:
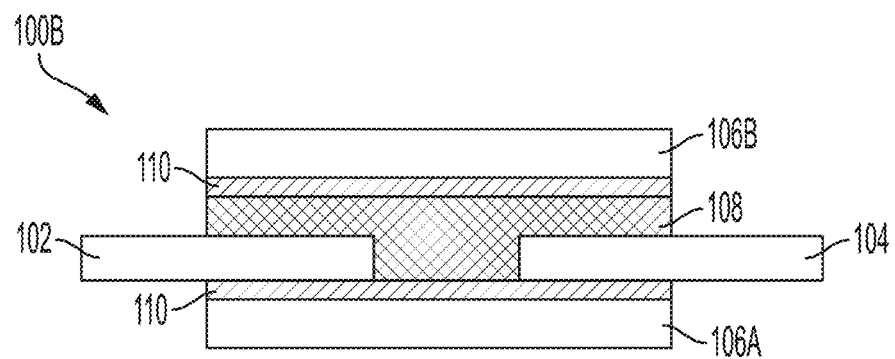
FIG. 2 is a schematic illustration of a cross-sectional view of another multi-terminal RRAM device including four terminals, according to one or more embodiments as shown and described herein.

The embodiments described herein are directed to the design, fabrication, testing, and methods of use for a multi-terminal memristor (e.g., a multi-terminal resistive random access memory (RRAM) device) with at least three terminals and based on thin film metal oxides. RRAM devices are non-volatile memory (NVM) devices that change resistance across a dielectric, solid-state material to create oxygen vacancies as defects and store data through this displacement of charged oxygen ions. While a dielectric is normally insulating, the dielectric described herein may conduct through a region of high concentration of defects formed by applying a sufficiently high voltage across the dielectric, where the region may be reset to result in a high resistance state (HRS) preventing conduction or set to result in a low resistance state (LRS) allowing for conduction. The multi-terminal RRAM devices as described herein include device conductance that is continuous over three orders of magnitude, show significant retention and endurance, and show comparatively low set and reset current.

Two-terminal memristors are two terminal (2T) RRAM devices that include a pair of terminals (e.g., a top electrode and a bottom electrode) separated by a metal oxide. Advantageously, a third-terminal as a control gate (e.g., a gate electrode) for the multi-terminal resistive random access memory (RRAM) devices described herein separate read and write terminals to allow for continuous conductance state tuning and flexible architectures compared to 2T RRAM devices that use the same terminal to read and configure the 2T RRAM device. The 2T RRAM device uses the same terminals to read and configure the device by keeping a read voltage (e.g., $V_D$, also referable to as a drain voltage) below a threshold voltage $V_T$ to retain a device state, which makes a multiple state device and continuous resistive-state (RS) tunable device difficult to achieve. The 2T RRAM device may be read and then programmed repeatedly until a desired state is achieved, though this must be done sequentially in the 2T RRAM device.

Further, setting and resetting of the 2T RRAM device on a shared terminal that is used to read the device is power consuming due to the device structure. In a 2T RRAM, a set refers to forming a conductive path in the metal oxide disposed between the pair of terminals (e.g., a top electrode and a bottom electrode) through application of a voltage to one of the terminals to form a low resistance state (LRS) to allow for conduction. A reset in the 2T RRAM refers to breaking the conductive path in the metal oxide between the pair of terminals through application of a voltage of an opposing polarity to one of the terminals to form a high resistance state (HRS) to limit or prohibit conduction. Such devices may store binary values of 0 or 1 or may be continuous and store multiple states not configured to the binary values of 0 or 1. In contrast to other capacitance and/or transistor based memory devices, a RRAM uses creation of physical defects called oxygen vacancies in a layer of the metal oxide disposed between the pair of terminals to represent information. RRAM is an NVM device that stores binary data based on a change in level of resistance, which itself is a function of applied voltage. RRAM stores data using ions that change electrical resistance states in a metal oxide disposed between a pair of terminals. In particular, RRAM stores data using altercation of ions or defects distribution from one state to another, rather than using electrons to store data as an electrical charge, based on changes in electrical resistance. Such a set to an LRS may occur through, for example, application of positive voltage to a top electrode of the pair of terminals to induce positively-ionized defect migration away from the top electrode toward a depleted path in the metal oxide to reconnect a conductive filament between the top electrode and a bottom electrode. Alternatively, a reset to an HRS may occur through application of a negative voltage to the top electrode to induce positively-ionized defect migration toward the top electrode to create the depleted path in the metal oxide between the top electrode and the bottom electrode. Such resistive memory assists to reduce energy consumption and increasing performance compared to, for example, transistors utilizing electron storage. It should be understood and is contemplated within the scope of this disclosure that due the continuous states of the devices described herein, the devices may include multiple HRS and/or LRS states.

In contrast to 2T RRAM, the multi-terminal resistive random access memory (RRAM) devices described herein use a third terminal to set and reset separate from a read using one of a pair of first and second terminals. Such a third terminal (3T) RRAM device allows for versatile architectures in neuromorphic and other integrated-memory systems. Further, in contrast to another NVM device of a flash memory having higher power consumption, the states of which are defined by a shift in in a threshold voltage of an underlying transistor as described below, the multi-terminal RRAM devices described herein is an RRAM NVM device that has a bit state defined as HRS (e.g., bit state is assigned a binary value of 0) or LRS (e.g., bit state is assigned a binary value of 1). A flash memory cell is an electronic, solid-state, NVM that may be electrically erased and reprogrammed, and which may be organized as a NAND-type or NOR-type. Such flash memory may be a floating gate transistor similar to a metal-oxide-semiconductor field-effect transistor (MOSFET) having a source, drain, control gate, and underlying transistor with the inclusion of an additional, electronically isolated floating gate that is surrounded and insulated by an oxide layer and disposed between a control gate and a doped semiconductor substrate. The MOSFET may be, for example, an n-type metal-oxide-semiconductor including an NPN structure for the semiconductor with two pn junctions forming a MOSFET channel (e.g., an nMOS). Electrons in the electronically isolated floating gate are trapped such that when the floating gate is charged with electrons, a cell threshold voltage $VT_1$ increases such that a higher voltage $VT_2$ would need to be applied to make the MOSFET channel conductive. To read a value from the underlying transistor, an intermediate voltage $VT_{INT}$ between $VT_1$ and $VT_2$ is applied to the top control gate. Conduction by the MOSFET channel at $VT_{INT}$ indicates an uncharged floating gate and a logical 1 is stored, whereas non-conductance by the MOSFET channel at $VT_{INT}$ indicates a charged floating gate prohibiting conductivity and a logical 0 is stored. RRAM includes a lower read latency and a faster write performance than flash memory, in which data is stored as an electrical charge, and in which more power consumption is utilized through a boost converter to tunnel the electrons.

The multi-terminal RRAM devices described herein are NVM devices with bit states defined based on a resistance of HRS or LRS and not defined by a shift in a transistor's threshold voltage or based on whether a transistor threshold voltage is met to turn a transistor on to conduct across a MOSFET channel path of a p-type and/or n-type transistor. Such other memory devices in which data storage is not based on a change of resistance in a metal oxide rather store data through electrons and utilize electrons and holes for conduction along a p-type or n-type doped channel path. In contrast, RRAM devices create defects as oxygen vacancies that, combined with movement of oxygen ions, change the material properties of a metal oxide conduction path channel to change the conduction path to an HRS or an LRS based on an applied voltage. Multi-terminal RRAM devices described herein provide a highly-scalable, reconfigurable, tunable, and energy-efficient NVM device technology that is able to be integrated on-chip (and is complementary metal-oxide-semiconductor (CMOS) compatible) and/or be used for off-chip data storage as well as for other emerging applications such as artificial intelligence (AI), deep neural network (DNN), and neuromorphic computing. In embodiments, resistive switching between a top electrode and a bottom electrode as two terminals of a multi-terminal RRAM device is controlled by applying a bias on a third terminal as described herein, which may be a third electrode such as a gate electrode.

Referring initially to FIG. 1, a cross-sectional view of a multi-terminal RRAM device 100 is illustrated as a three-terminal (3T) RRAM device 100A. It should be understood that the terms "device" and "structure" are interchangeably used with respect to the devices 100 described throughout this disclosure. Various, non-limiting embodiments of the multi-terminal resistive random access memory (RRAM) device 100 are depicted in FIGS. 1-8 as devices 100A-100F. Each device 100 described herein includes at least a first electrode 102, a second electrode 104, a gate 106, and a metal oxide 108. One or more devices 100 may include one or more insulator layers 110 and one or more additional gates 106, as described in greater detail further below. In an embodiment, and as described below, a non-volatile RRAM device 100 may include the first electrode 102, the second electrode 104, the metal oxide 108 disposed between the first electrode 102 and the second electrode 102, and at least a first gate 106 configured to apply a voltage bias to change a resistive state in the metal oxide 108. The metal oxide 108 may be configured to contact a first interface of the first electrode 102 and a second interface of the second electrode 104 to define a conduction path 114 therebetween, and the first gate 106 may be configured to apply the voltage bias to change the resistive state in the conduction path 114 of the metal oxide 108. Such change may switch the resistive state in the conduction path 114 between the first electrode 102 and the second electrode 104 between a low resistance state (LRS) and a high resistance state (HRS), as will be described in greater detail below. In embodiments, a longitudinal axis of the first electrode 102 may be positioned parallel to a longitudinal axis of the second electrode 104, and a longitudinal axis of the conduction path 114 of the metal oxide 108 may be positioned transverse (e.g., perpendicular) to the longitudinal axis of the first electrode 102 and the longitudinal axis of the second electrode 104.

Referring again to FIG. 1, the 3T RRAM device 100A includes a first electrode 102 as a top electrode, a second electrode 104 as a bottom electrode, and a gate 106. The first electrode 102, the second electrode 104, and the gate 106 comprise three-terminals in the 3T RRAM device 100A. The 3T RRAM device 100A further includes a metal oxide 108, which is inserted between the first electrode 102 and the second electrode 104, and an insulator layer 110 disposed between the metal oxide 108 and the gate 106.

In embodiments, the at least a third terminal described herein may include one or more gates 106, which one or more gates 106 may comprise a non-reactive material or a reactive, oxidizable material with low resistivity. The material of the one or more gates 106 may include, but not limited to, Tungsten (W), Titanium (Ti), Titanium Nitride (TiN), Aluminum (Al), Tantalum (Ta), Copper (Cu), Tantalum Nitride (TaN), or a like metal or semi-metal material or non-stochiometric ionic oxide. The first electrode 102 and/or the second electrode 104 may comprise a non-reactive, oxidation-resistant metal or semi-metal material such as TiN, TaN, Ruthenium (Ru), Titanium Nitride (TiN), Pt, Au, or a like metal or semi-metal material. In alternative embodiments, the first electrode 102 and/or the second electrode 104 may comprise a reactive oxidizable metal or semi-metal material including, but not limited to, Ti, Ta, W, Al, Zirconium (Zr), Hafnium (Hf), or Magnesium (Mg). Further in embodiments, the metal oxide 108 comprises a switching oxide of a general transition metal oxide form $MO_Z$ and may include, but is not limited to, Strontium Titanate ($SrTiO_3$), Hafnium Oxide ($HfO_x$), Tantalum Oxide ($TaO_x$), Niobium Oxide ($NbO_x$), Magnesium Oxide (MgO), Zirconium Dioxide ($ZrO_2$), Titanium Dioxide ($TiO_2$), or the like, may include doped versions of the $MO_Z$ materials, and/or may include other transition metal oxides with ionizable oxygen. Thus, the metal oxides described herein may include any non-stochiometric ionic oxides such as, but not limited to: $SrTiO_x$, $NbO_x$, $TiO_x$, $HfO_x$, $TaO_x$, doped $SrTiO_x$, doped-$TiO_x$, doped-$NbO_x$. The one or more insulator layers 110 may include insulator materials such as, but not limited to, Silicon Dioxide ($SiO_2$), Silicon Nitride ($Si_3N_4$), Hafnium Oxide ($HfO_x$), or the like. The one or more insulator layers 110 may include a gate insulator 110 between the at least first gate 106 and the metal oxide 108 as a non-switching, gate-barrier layer disposed therebetween. The gate insulator 110 may include, but not be limited to, a non-ionic oxides and nitrides such as $SiO_2$, SiN, or a stochiometric oxide with low defect density, such as $HfO_2$, $MgO_2$, $Al_2O_3$, or AlN, or the like. In embodiments, the gate insulator 110 may include non-ionic oxides, non-ionic nitrides, or a stochiometric oxide with low defect density, and the gate insulator may be configured to act as a non-switching gate-barrier to limit gate leakage during programming Referring to FIG. 2, a multi-terminal RRAM device 100B includes a first electrode 102 as a designated top electrode, a second electrode 104 as a designated bottom electrode, a first gate 106A, and a second gate 106B. The first electrode 102, the second electrode 104, the first gate 106A, and the second 106B comprise four-terminals in the multi-terminal RRAM device 100B. The multi-terminal RRAM device 100B further includes a metal oxide 108 further includes a metal oxide 108, which is attached between the first electrode 102 and the second electrode 104, and a pair of insulator layers 110 disposed between the metal oxide 108 and each of the first gate 106A and the second gate 106B. As a non-limiting example, the pair of insulator layers 119 may be, for example, $Si_3N_4$.

Figure 3:
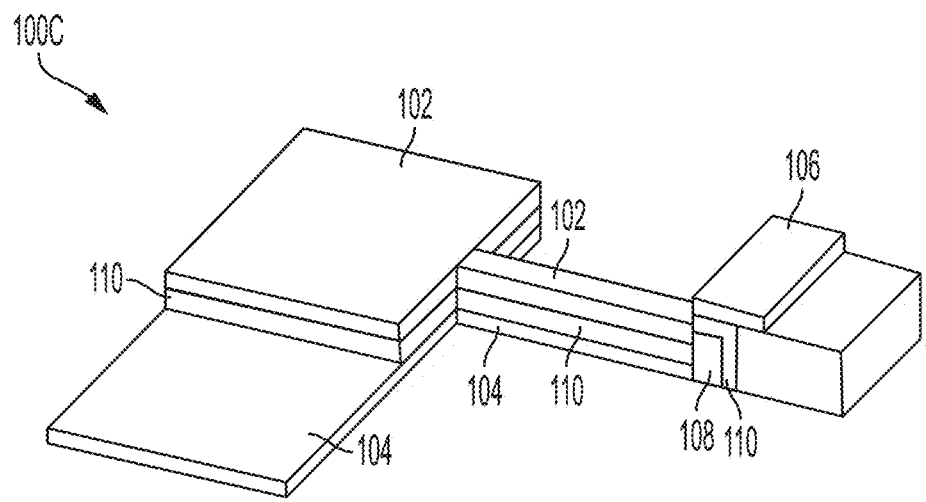
FIG. 3 is an isometric view of a transverse-gated 3T RRAM structure, according to one or more embodiments as shown and described herein.
Figure 4A:
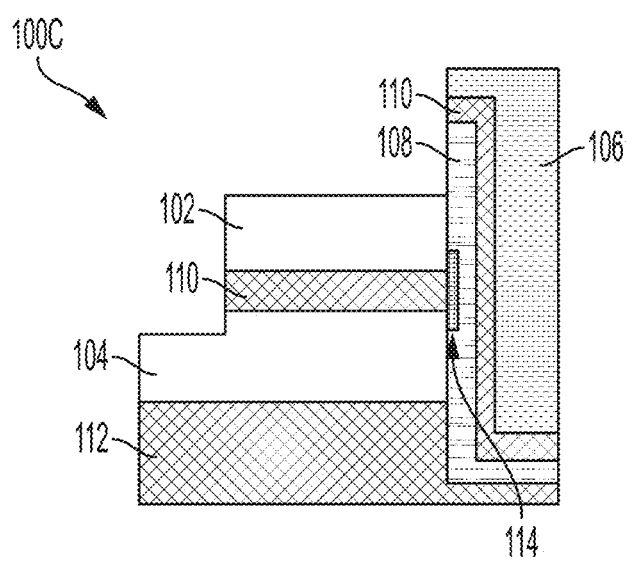
FIG. 4A is a cross-sectional view of the transverse-gated 3T RRAM structure of FIG. 3.
Figure 4B:
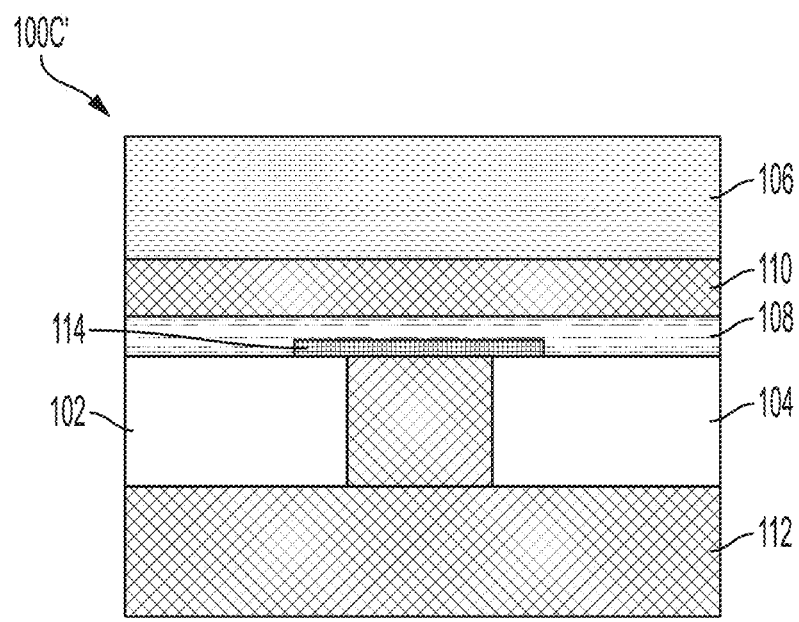
FIG. 4B is a cross-sectional view of another embodiment of the transverse-gated 3T RRAM structure of FIG. 3.

FIG. 3 depicts a transverse-gated 3T RRAM structure 100C, FIG. 4A depicts a cross-sectional view of the transverse-gated 3T RRAM structure 100C, and FIG. 4B depicts a cross-sectional view of another embodiment of a transverse-gated 3T RRAM structure 100C'. Referring to FIG. 4A, the transverse-gated 3T RRAM structure 100C includes a first electrode 102, a second electrode 104, and a gate 106 as the three-terminals. The transverse-gated 3T RRAM structure 100C further includes a metal oxide 108 disposed between the gate 106 and the first and second electrodes 102, 104. An insulator layer 110 is further disposed between the gate 106 and the metal oxide 108. Another insulator layer 110 is disposed between the first electrode 102 and the second electrode 104. An insulating substrate 112 is disposed below the second electrode 104. The insulating substrate 112 may be, for example, oxidized Silicon. A longitudinal axis of the gate 106 may be positioned transverse to the longitudinal axis of the first electrode 102 and the longitudinal axis of the second electrode 104. In an embodiment, the gate 106 and the metal oxide 108 are disposed along parallel longitudinal axes that are transverse to the parallel longitudinal axes of the first electrode 102 and the second electrode 104. A conduction path 114 of the metal oxide 108 is disposed between an interface between the metal oxide 108 and the first electrode 102 and an interface between the metal oxide 108 and the second electrode 104. In a non-limiting embodiment, the first electrode 102 and the second electrode 104 comprise TiN, the gate 106 comprises W, the metal oxide 108 comprises $SrTiO_3$, the insulator layers 110 comprise $Si_3N_4$, and the insulating substrate 112 comprises $SiO_2$. The insulating substrate 112 may be in contact with the metal oxide 108. An additional substrate comprising Si, for example, may be disposed below the insulating substrate 112, but the metal oxide 108 will contact the insulating substrate 112 and not the additional substrate. The additional substrate may be separated from the metal oxide 108 by the insulating substrate 112. In an embodiment, the transverse-gated 3T RRAM structure 100C is read by measuring conductance from the first electrode 102 (e.g., one of a top electrode and a bottom electrode) and the second electrode 104 (e.g., the other of the top electrode and the bottom electrode) for different resistive states, as described in greater detail below. As a non-limiting example, the transverse-gated 3T RRAM structure 100C is read by measuring conductance from a top electrode to a bottom electrode while being set or reset by respectively applying positive or negative pulses to the gate 106.

Figure 5:
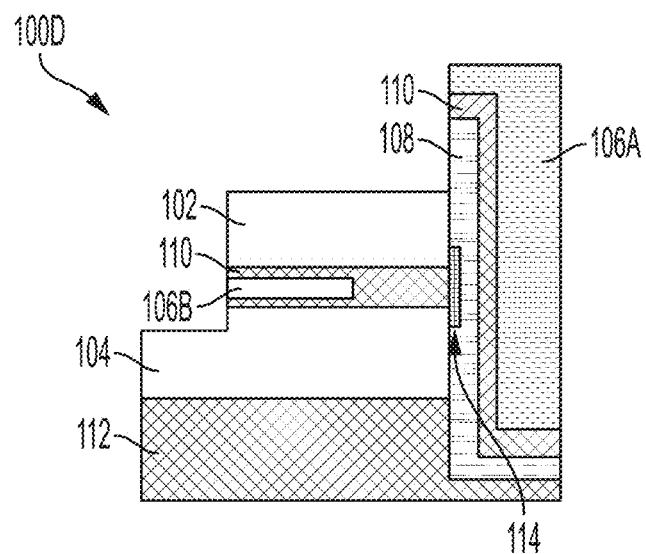
FIG. 5 is a cross-sectional view of another embodiment of a transverse-gated multi-terminal RRAM structure, according to one or more embodiments as shown and described herein.

FIG. 5 depicts a cross-sectional view of another transverse-gated multi-terminal RRAM structure 100D. The transverse-gated multi-terminal RRAM structure 100D includes a first electrode 102, a second electrode 104, a gate 106A, and a gate 106B as the multi-terminals. The transverse-gated multi-terminal RRAM structure 100D further includes a metal oxide 108 disposed between the gate 106A and the first and second electrodes 102, 104. An insulator layer 110 is further disposed between the gate 106A and the metal oxide 108. A second insulator layer 110 is disposed between the first electrode 102 and the second electrode 104. The second gate 106B is disposed within the second insulator layer 110 and is separated from the metal oxide 108, the first electrode 102, and the second electrode 104 by the second insulator layer 110. A semiconductor substrate 112 is disposed below the second electrode 104. The gate 106 and the metal oxide 108 are disposed along parallel longitudinal axes that are transverse to the parallel longitudinal axes of the first electrode 102 and the second electrode 104. A conduction path 114 of the metal oxide 108 is disposed between an interface between the metal oxide 108 and the first electrode 102 and an interface between the metal oxide 108 and the second electrode 104. In a non-limiting embodiment, the first electrode 102, the second electrode 104, and the gate 106B comprise TiN, the gate 106A comprises W, the metal oxide 108 comprises SrTiO$_3$, the insulator layers 110 comprise Si$_3$N$_4$, and the semiconductor substrate 112 comprises SiO$_2$ and Si.

Figure 6:
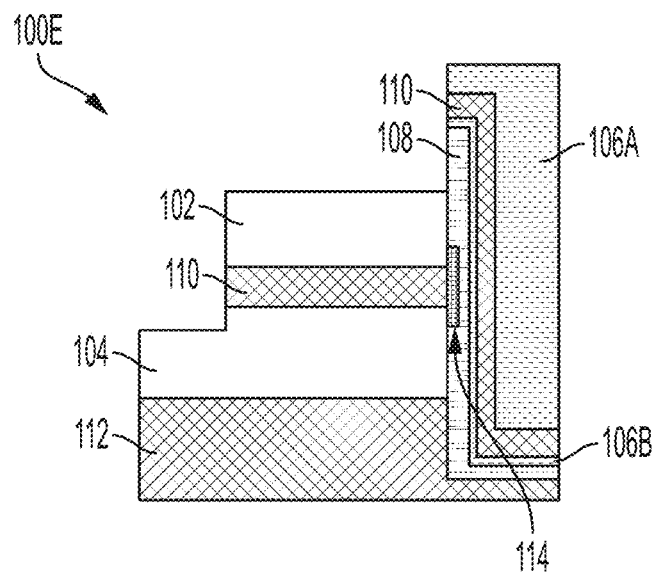
FIG. 6 is a cross-sectional view of yet another embodiment of a transverse-gated multi-terminal RRAM structure, according to one or more embodiments as shown and described herein.

FIG. 6 depicts a cross-sectional view of another transverse-gated multi-terminal RRAM structure 100F. The transverse-gated multi-terminal RRAM structure 100F includes a first electrode 102, a second electrode 104, and gate 106A, and a gate 106B as the multi-terminals. The transverse-gated multi-terminal RRAM structure 100C further includes a metal oxide 108 disposed between the gates 106A, 106B and the first and second electrodes 102, 104. An insulator layer 110 is further disposed between the gates 106A, 106B. Another insulator layer 110 is disposed between the first electrode 102 and the second electrode 104. A semiconductor substrate 112 is disposed below the second electrode 104. The gates 106A, 106B and the metal oxide 108 are disposed along parallel longitudinal axes that are transverse to the parallel longitudinal axes of the first electrode 102 and the second electrode 104. A conduction path 114 of the metal oxide 108 is disposed between an interface between the metal oxide 108 and the first electrode 102 and an interface between the metal oxide 108 and the second electrode 104. In a non-limiting embodiment, the first electrode 102 and the second electrode 104 comprise TiN, the gate 106A comprises W, the gate 106B comprises W as an O$_2$ reservoir, the metal oxide 108 comprises SrTiO$_3$, the insulator layers 110 comprise Si$_3$N$_4$, and the semiconductor substrate 112 comprises SiO$_2$ and Si. As an embodiment, the gate 106B comprising W may act as an O$_2$ reservoir configured to participate in the oxidation reduction (redox) reactions with the metal oxide 108.

Figure 7:
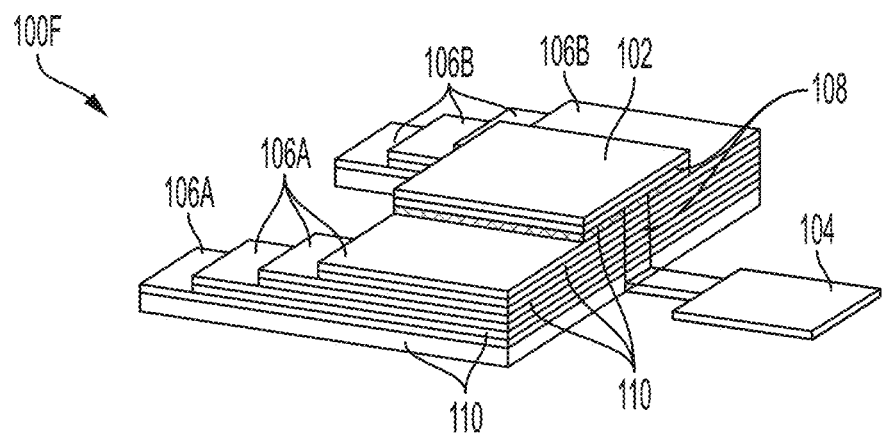
FIG. 7 is an isometric view of a side-gated multi-terminal RRAM structure with multiple gate layers, according to one or more embodiments as shown and described herein.
Figure 8:
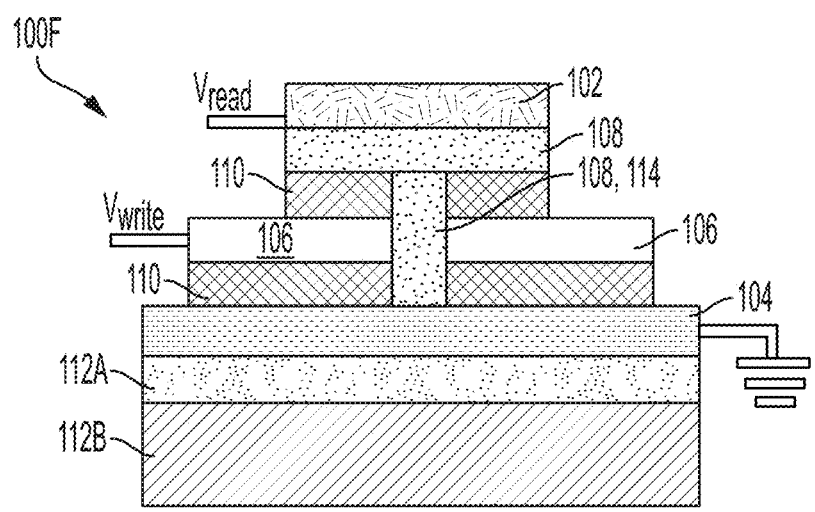
FIG. 8 is a cross-sectional view of the side-gated multi-terminal RRAM structure of FIG. 7 with a single gate layer.

FIG. 7 depicts a side-gated multi-terminal RRAM structure 100F of a high-gate embodiment with multiple gate layers configured to increase granular control of resistivity, and FIG. 8 depicts a cross-sectional view of the side-gated multi-terminal RRAM structure 100F with a single gate layer. The side-gated multi-terminal RRAM structure 100F includes a first electrode 102, a second electrode 104, and a gate 106. As shown in FIG. 7, the gate 106 may include a first gate 106A and a second gate 106B that are separated by a metal oxide 108. A side portion of the metal oxide 108 is disposed between and connects the first and second electrodes 102, 104 in a direction transverse to the longitudinal axes of the first and second electrodes 102, 104. A top portion of the metal oxide 108 is disposed below the first electrode 102 and includes an axis parallel to the longitudinal axis of the first electrode 102. The gates 106A, 106B are disposed transverse to the metal oxide 106 such that respective longitudinal axes are transverse to the side portion of the metal oxide 108 connecting the first electrode 102 and the second electrode 104. A longitudinal axis of the first gate 106A may be positioned parallel to the longitudinal axis of the first electrode 102 and the longitudinal axis of the second electrode 104. Referring to FIG. 8, insulator layers 110 are further disposed between the gate 106, the second electrode 104, and the top portion of the metal oxide 108. A first substrate 112A (e.g., the insulating substrate 112) and a second additional substrate 112B are disposed below the second electrode 104. The first substrate 112A may be alternatively another insulator layer 110. A conduction path of the metal oxide 108 is disposed along the side portion of the metal oxide 108 between an interface between the metal oxide 108 and the first electrode 102 and an interface between the metal oxide 108 and the second electrode 104. In a non-limiting embodiment, the first electrode 102 and the second electrode 104 comprise TiN, the gate 106 comprises W, the metal oxide 108 comprises SrTiO$_3$, the insulator layers 110 may each comprise a form of SiN (such as Si$_3$N$_4$), the insulating substrate 112 comprises SiO$_2$ and is in contact with the metal oxide 108, and the additional substrate 112B comprises Si and is not in contact with the metal oxide 108. In an embodiment, the side-gated multi-terminal RRAM structure 100F is read by applying a bias from a top electrode to a bottom electrode (e.g., the first electrode 102 to the second electrode 104) while written by applying a bias across each independent front-gate to back-gate (e.g., the first gate 106A to the second gate 106B), where the metal oxide 108 is gated by the front-gate and back-gate. An LRS may be achieved by formation of metallic or defect-assisted filament between the top electrode and the bottom electrode via bias on the front-gate and the back-gate. An HRS may be achieved by dissolution of metallic or defect-assisted filament between the top electrode and the bottom electrode via bias on the front-gate and the back-gate. In an embodiment, formation of the filament occurs through a one-time bias from the top electrode to the bottom electrode. Subsequent HRS/LRS switching may then be performed by driving oxygen vacancies (V$_o^{2+}$) into and out of this filamentary region, which can be achieved by applying bias from the front-gate to the back-gate to result in ionic current via oxygen movement in under the electric field. In embodiments, the side-gated multi-terminal RRAM structure 100F is read by applying a bias from the top electrode o the bottom electrode and can simultaneously read/write to allow for robust monitoring capabilities during state-change. Further, multi-gate RRAM stacks as described herein may be reconfigured to 2$^n$ unique states through setting resetting subsections of the conduction path 114 of the metal oxide 108 through control of each of the independent front and back gate bias, as described in greater detail further below.

FIGS. 9-22 are directed to the multi-terminal RRAM device 100 operation, FIGS. 23-24 are directed to integration of the multi-terminal RRAM device 100 in a cross bar architectures, which will be described in greater detail further below. With respect to FIGS. 9-22, FIGS. 9-15 are directed to operation and testing results of the transverse-gated 3T RRAM structure 100C of FIG. 4 in an embodiment including a channel depth of 100 μm, and FIGS. 20-22 are directed to operation and testing of the side-gated multi-terminal RRAM structure 100F of FIG. 8. In an embodiment, operation of such devices 100 may include a method of switching a resistive state in a non-volatile multi-terminal RRAM device 100 through applying a voltage bias with at least a first gate 106 of the non-volatile multi-terminal RRAM device 100, the non-volatile multi-terminal RRAM device 100 further including the first electrode 102, the second electrode 104, and the metal oxide 106 defining the conduction path 114 positioned between the first electrode 102 and the second electrode 104. Based on the polarity of the voltage bias applied, as described below, the method may further include switching the resistive state in the conductance path 114 between a low resistance state (LRS) and a high resistance state (HRS) in the conduction path 114 or providing an analog state reconfiguration based on an intermediate distribution of oxygen vacancies. In an embodiment, the first electrode 102 and the second electrode 104 are grounded, and the voltage bias is applied as a gate voltage V$_G$ to one of the first electrode 102 and the second electrode 104 in a write operation, and a read voltage V$_D$ is applied to one of the first electrode 102 and the second electrode 104 in a simultaneous read operation. As a non-limiting example, the voltage bias is applied as a gate voltage V$_G$ to the second electrode 104 designated as a bottom electrode in a write operation, and a read voltage V$_D$ is applied to the first electrode 102 designated as a top electrode in a simultaneous read operation, and the top electrode and the bottom electrode are grounded.

Figure 9:
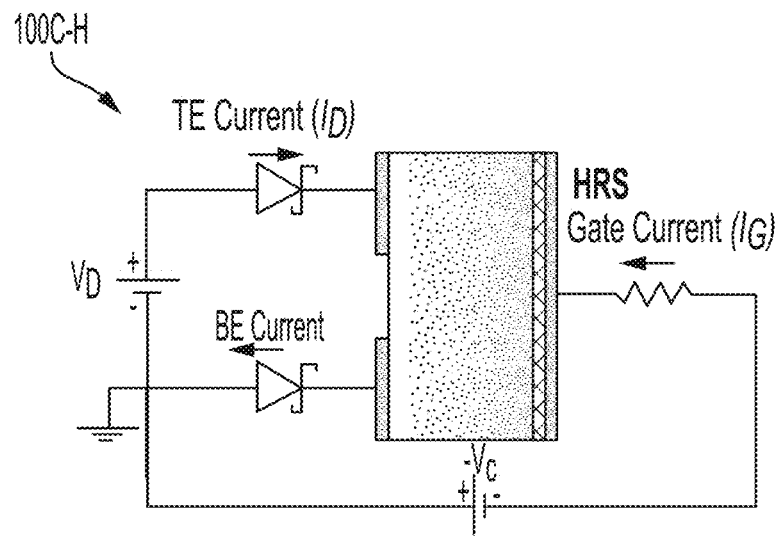
FIG. 9 illustrates a circuit diagram of device operation in a high resistance state (HRS) for the transverse-gated 3T RRAM structure of FIG. 4.
Figure 10:
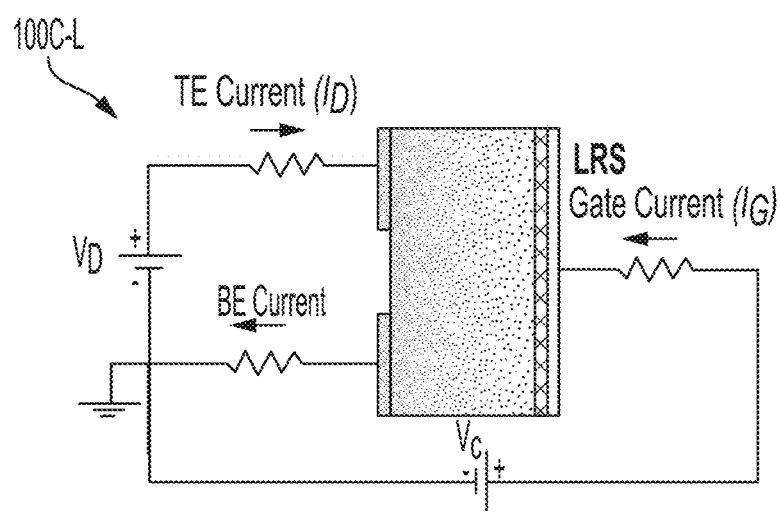
FIG. 10 illustrates a circuit diagram of device operation in a low resistance state (LRS) for the transverse-gated 3T RRAM structure of FIG. 4.

FIG. 9 is a simplified behavioral circuit diagram of device operation in a high resistance state (HRS) for the transverse-gated 3T RRAM structure 100C of FIG. 4, and FIG. 10 is a behavioral circuit diagram of device operation in a low resistance state (LRS) for the transverse-gated 3T RRAM structure 100C. As described above, the transverse-gated 3T RRAM structure 100C includes a first electrode 102, a second electrode 104, a gate 106, a metal oxide 108 disposed between the gate 106 and the first and second electrodes 102, 104, and a conduction path 114 of the metal oxide 108 disposed between the interfaces of the first and second electrodes 102, 104 with the metal oxide 108. The transverse-gated 3T RRAM structure 100C further includes an insulator layer 110 disposed between the gate 106 and the metal oxide 108, another insulator layer 110 disposed between the first electrode 102 and the second electrode 104, and a semiconductor substrate 112 disposed below the second electrode 104. The first electrode 102 is shown as a top electrode, and the second electrode 104 is shown as a bottom electrode. Resistive switching between the first electrode 102 and the second electrode 104 is controlled by applying bias on the gate 106.

The transverse-gated 3T RRAM structure 100C operates based on a modulation of oxygen ions ($O^{2-}$) and oxygen vacancies ($V_O^{2+}$) in the conduction path 114 as the active area of the metal oxide 108 between the first electrode 102 and the second electrode 104. The metal oxide 108 has mobile oxygen ions and oxygen vacancies that may be considered and act similar to dopants but that are highly mobile to affect the properties of the channel of the metal oxide 108 formed by the conduction path 114. Application of a positive bias as a gate voltage $V_G$ with respect to the second electrode 104 (as a designated bottom electrode, for example) pulls the negative oxygen ions ($O^{2-}$) toward the gate 106 and away from the conduction path 114 between the first electrode 102 and the second electrode 104. As the conduction path 114 becomes rich in oxygen vacancies ($V_O^{2+}$), the conductivity between the first electrode 102 and the second electrode 104 is increased, which places the device 110C (FIG. 4) into an LRS. Alternatively, application of a negative bias as a gate voltage $V_G$ with respect to the second electrode 104 (as a designated bottom electrode, for example) pushes the negative oxygen ions ($O^{2-}$) from the gate 106 and back toward the conduction path 114 to recombine with oxygen vacancies ($V_O^{2+}$) and reduce conductivity between the first electrode 102 and the second electrode 104. Such reduced conductivity places the device 100C into an HRS. Thus, a net concentration ($N_{VO}$) of oxygen vacancies ($V_O^{2+}$) in the conduction path 114 modulates the state of the device 100C. Further, the net concentration ($N_{VO}$) is a continuous function of bias (e.g., gate voltage $V_G$) on the gate 106 such that a continuous modulation in resistive states is achievable, which is a desirable property for neuromorphic and data storage applications. As the conduction path 114 becomes rich in oxygen vacancies ($V_O^{2+}$), the conductivity between the first electrode 102 and the second electrode 104 is increased, which places the device 110C into an LRS.

Referring to FIG. 9, a circuit diagram of device operation in an HRS for the transverse-gated 3T RRAM structure 100C is shown. As described above, a negative bias, as shown in FIG. 9, is applied as the gate voltage $V_G$ through the gate 106 (FIG. 4) with respect to the second electrode 104 (as a designated bottom electrode BE in FIG. 9, for example). The negative gate bias repels the negatively-charged oxygen ions ($O^{2-}$) from the gate 106 and back toward the conduction path 114 to recombine with oxygen vacancies ($V_O^{2+}$). The first electrode 102 and the second electrode 104 may comprise material configured to act as schottky diodes when in contact with the metal oxide 108, allowing current flow in a reverse cathode to anode direction when a Schottky forward voltage is reached. The first electrode 102 and the second electrode 104 respectively include a current (e.g., read current $I_D$ of the first electrode 102) and direction flow, as does the gate 106 (gate current $I_G$). Such an increase in oxygen ions ($O^{2-}$) in the conduction path 114 and reduction in oxygen vacancies ($V_O^{2+}$) reduces conductivity between the first electrode 102 and the second electrode 104, which places the device 100C into an HRS. The conduction path 114 is reset (e.g., broken) in the HRS. Thus, when the polarity of the voltage bias applied is negative, the voltage bias is applied as a negative gate voltage $-V_G$ to one of the first electrode 102 and the second electrode 104 such that negatively-charged oxygen ions ($O^{2-}$) are repelled away from the first gate 106 and toward the conduction path 114 of the metal oxide 108. This action results in resetting the conduction path 114 such that the negatively-charged oxygen ions ($O^{2-}$) recombine with and reduce oxygen vacancies ($V_O^{2+}$) in the conduction path 114 to define the HRS and break conductance in the conduction path 114.

Referring to FIG. 10, a circuit diagram of device operation in an LRS for the transverse-gated 3T RRAM structure 100C is shown. As described above, a positive bias, as shown in FIG. 10, is applied as the gate voltage $V_G$ through the gate 106 (FIG. 4) with respect to the second electrode 104. The positive gate bias attracts and pulls the negative oxygen ions ($O^{2-}$) toward the gate 106 and away from the conduction path 114 between the first electrode 102 and the second electrode 104. The first electrode 102 and the second electrode 104 respectively include a current (e.g., read current $I_D$, also referable to as drain current, of the first electrode 102) and direction flow as well as a resistance to current, as does the gate 106 (gate current $I_G$). As the conduction path 114 becomes rich in oxygen vacancies ($V_O^{2+}$), the conductivity between the first electrode 102 and the second electrode 104 is increased, which places the device 110C (FIG. 4) into an LRS. The conduction path 114 is set (e.g., formed) in the LRS. Thus, when voltage bias is applied as a positive gate voltage $+V_G$, negatively-charged oxygen ions ($O^{2-}$) are attracted to the first gate 106 and away from the conduction path 114 of the metal oxide 108. This action results in setting the conduction path 114 such that increased oxygen vacancies ($V_O^{2+}$) in the conduction path 114 define the LRS and facilitate conduction in the conduction path 114.

In embodiments in which the metal oxide 108 acts similar to a wide bandgap semiconductor with respect to the mobile oxygen vacancies ($V_O^{2+}$), and the gate 106 and first and second electrodes 102, 104 are non-reactive to the metal oxide 108, a conductance change in the conduction path 114 may be achieved in two manners. First, an increase or decrease in conductivity in the conduction path 114 may occur through, respectively, higher or lower oxygen vacancies ($V_O^{2+}$) concentrations resulting in conduction mechanisms including trap assisted tunneling, ohmic, and/or mixed-ionic electronic conduction. Second, an increase or decrease in Schottky contact conductivity between the pair of conduction path region/electrode interfaces, such as a first interface between the first electrode 102 and the metal oxide 108 and a second interface between the second electrode 104 and the metal oxide 108, may occur through, respectively, an accumulation or depletion of the oxygen vacancies ($V_o^{2+}$). Control of contact resistivity at such interfaces as metal interfaces may thus occur through modulation of the oxygen vacancies ($V_o^{2+}$) at the metal interface. As a non-limiting example, in another embodiment and for such contact resistivity control, the metal oxide 108 may comprise $TiO_2$. Analog reconfiguration in states can be achieved based on relative distribution of oxygen vacancies ($V_o^{2+}$) in the stack.

Figure 11A:
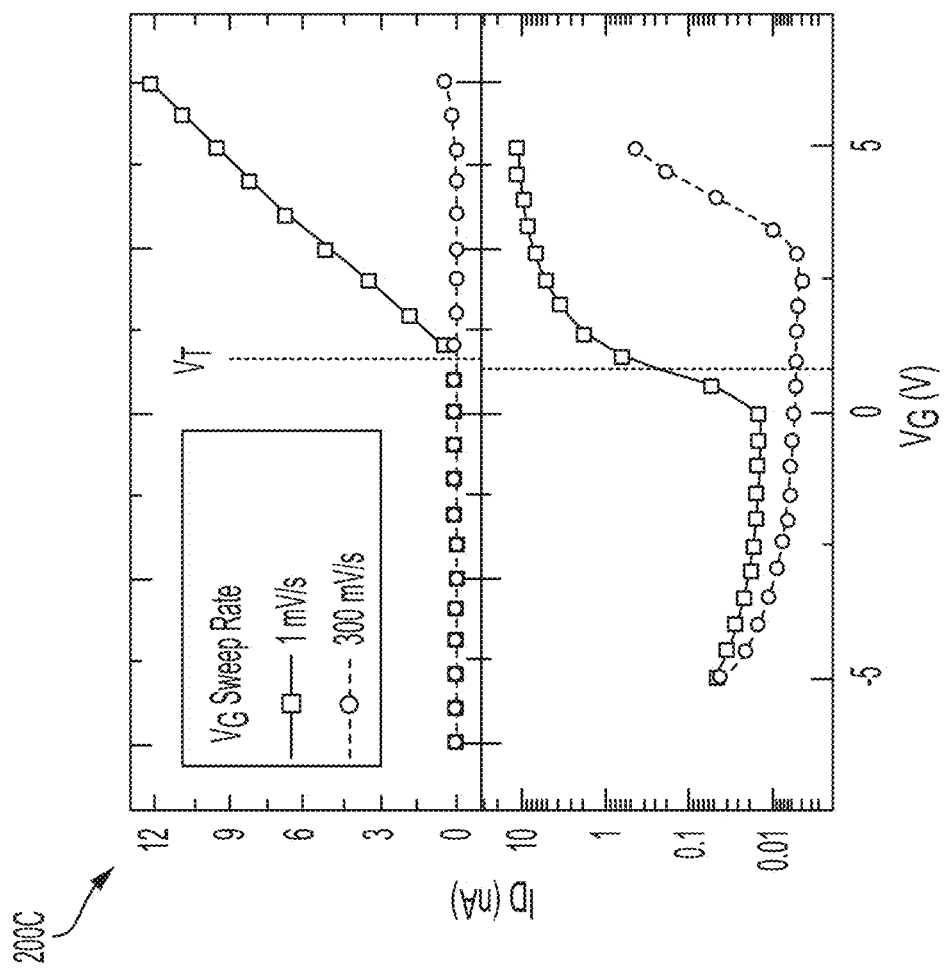
FIG. 11A is a graphical illustration of DC and transient device current for the transverse-gated 3T RRAM structure of FIG. 4 with gate voltage swept at different rates at a constant read voltage, according to one or more embodiments as shown and described herein.

FIG. 11A is a graphical illustration of DC and transient device current for the transverse-gated 3T RRAM structure 100C (FIG. 4) with gate voltage swept at different rates at a constant read voltage for a particular embodiment. In the particular embodiment, the first electrode 102 and the second electrode 104 comprise TiN, the gate 106 comprises W, the metal oxide 108 comprises $SrTiO_3$, the insulator layers 110 comprise $Si_3N_4$, and the insulating substrate 112 comprises $SiO_2$. The gate 106 applies a lateral electrical field to modulate the oxygen vacancies ($V_o^{2+}$) concentration in the conduction path 114 to change the device state, which change in device state is achieved by field-controlled modulation of the oxygen vacancies ($V_o^{2+}$) gradient in the metal oxide 108, which acts as a switching layer. Thus, programming current may be minimized with a gate insulator to allow for a reduced programming energy in comparison to, for example, 2T RRAM devices without a gate or other memory devices utilizing electron motion to store charge. For the particular embodiment of the transverse-gated 3T RRAM structure 100C, the gate 106 comprises W and is disposed parallel to the conduction path 114 to apply a lateral field to move the oxygen vacancies ($V_o^{2+}$) in and out of the conduction path 114. The insulator layer 110 comprising $Si_3N_4$ and disposed between the gate 106 and the metal oxide 108 reduces a gate current ($I_G$), also referenceable to as a write/erase current, compared to operation without the insulator layer 110. The metal oxide 108 acts as a slowly polarizing dielectric between the gate 106, the first electrode 102, and the second electrode 104. RRAM as an NVM device operates through change of resistance of such a solid dielectric material such that resistance varies based on different applied voltages. A dielectric breakdown, which occurs upon application of a voltage above a certain threshold, may occur in a RRAM that is temporary and reversible and that forms a filament and/or conduction path as described herein, allowing for use of the RRAM as a memristor and an NVM device to store data based on a change in resistance in the dielectric material. A controlled formation and destruction (e.g., set and reset, respectively) of such filaments or concentrated oxygen vacancies ($V_o^{2+}$) allows for digital data storage, and such set and reset may occur by application of different voltages. For the multi-terminal RRAM structures 100 of the present disclosure, the metal oxide 108 acts as the solid dielectric material in which resistance changes based on application of the gate voltage $V_G$ from the gate to one of the first and second electrodes 102, 104 as described herein. In an embodiment, a fabricated device of the particular embodiment of the structure 100C may have a channel depth of less than or equal to 100 μm. In other embodiments, the channel depth may be in a range of from about 100 μm to about 5 nm. Further in embodiments, channel length between the first electrode 102 and the second electrode 104 may be in a range of from about 5 nm to about 60 nm, and a distance between the gate 106 and the channel (e.g., conduction path 114) may be in a range of from about 5 nm to about 100 nm.

Referring again to FIG. 11A, a top and bottom of a graph 200C depicts DC and transient device current for the particular embodiment of the transverse-gated 3T RRAM structure 100C (FIG. 4) with gate voltage swept between −5V and 5V at different rates of 1 mV/s and 300 mv/S and at a constant read voltage of 2V. The top and bottom graphs are rescaled versions of one another, and the two lines in each are the transient, alternating current (AC) and the direct current (DC) curves with the sweep rates included, where the DC is 1 mV/s. A tested version of the particular embodiment for which FIGS. 11A-14B depict testing results includes a fabricated 100 μm interface device (as a fabricated structure 100C) for which measurements taken at room temperature and for which a designated bottom electrode (e.g., the second electrode 104) is set as a reference ground. As oxygen vacancies ($V_o^{2+}$) mobility tends to be low at room temperature, the DC and transient $V_G$-$I_D$ characteristics were measured by changing the gate voltage $V_G$ at different rates. FIG. 11A depicts the DC and transient currents measured by sweeping $V_G$ from −5V to 5V with a constant read voltage $V_D$ of 2V across the first electrode 102 and the second electrode 104 and measurement a corresponding read current ($I_D$). As shown in FIG. 11A, a final set stage of the fabricated structure 100C is generally linear after passing a threshold to resemble a $V_G$-$I_D$ characteristic of an n-channel MOSFET though having a non-volatile conduction state, unlike a MOSFET. A fitted threshold voltage $V_T$ of FIG. 11A for the linear region is 0.788 V and has a linear transconductance of 2.96 nA/V beyond the fitted threshold voltage $V_T$. A transient curve has a higher fitted threshold voltage $V_T$ and a nonlinear response, which indicates a polarization state of the metal oxide 108 is lagging behind the gate voltage $V_G$.

Figure 11B:
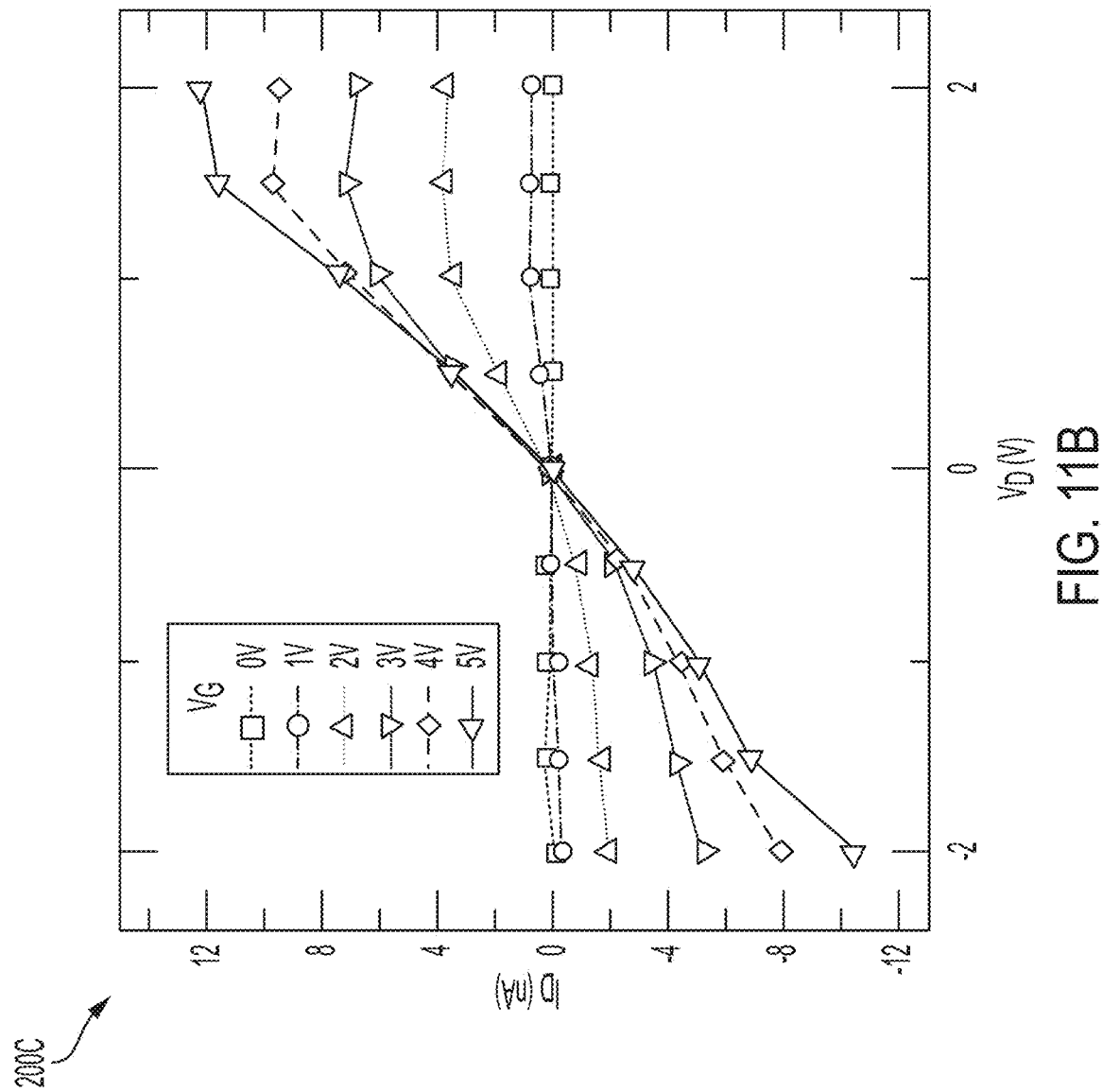
FIG. 11B is a graphical illustration of read current over read voltage for several gate voltages taken at DC for the transverse-gated 3T RRAM structure of FIG. 4, according to one or more embodiments as shown and described herein.

FIG. 11B depicts a graph 202C of read current over read voltage ($I_D$ over $V_D$) for several gate voltages taken at DC at a rate of 1 mV/s for the fabricated structure 100C. Thus, FIG. 11B shows a corresponding $V_D$-$I_D$ curve for the fabricated structure 100C for which the body is biased by the first electrode 102 (e.g., as a top electrode) and the second electrode 104 (e.g., as a bottom electrode), which are respectively set to $V_D$ and 0V. As shown in FIG. 11B, likely due to a lower net field across the metal oxide 108 with a positive read voltage $V_D$ that causes unidirectional saturation, read current $I_D$ rolls over with a higher read voltage $V_D$.

Figure 12:
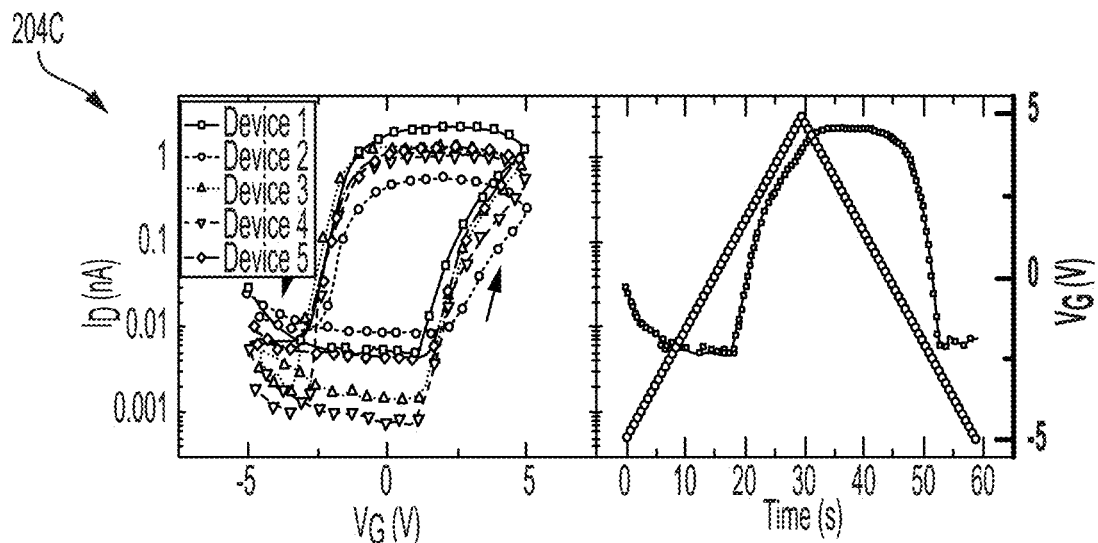
FIG. 12 is a graphical illustration of a set/reset cycle of a device including the transverse-gated 3T RRAM structure of FIG. 4 with a fixed read voltage of 1V, according to one or more embodiments as shown and described herein.

FIG. 12 depicts a graph 204C of a set/reset cycle of a plurality of devices of the fabricated structure 100C with a fixed read voltage $V_D$ of 1V to show a non-volatile operation of the fabricated structure 100C when sweeping the gate voltage $V_G$ more rapidly. A left plot of the graph 204C depicts a gate voltage to read current ($V_G$-$I_D$) curve for each of a first device to a fifth device, while a right plot of the graph 204C depicts the read current $I_D$ and the gate voltage $V_G$ over time of the first device. In FIG. 12, the gate voltage $V_G$ is swept from −5V to 5V and back again with a constant read voltage $V_D$ of 1V over a course of a minute on each of the five 100 μm devices. A significant hysteresis in the read current $I_D$ was observed with a forward and backward gate voltage $V_G$ sweep on all of the five devices. A low to high conductance rate at a gate voltage of $V_G$=0V is shown to be as high as 1093, which is large enough to distinguish several unique resistance states. A small increase in the read current $I_D$ when the gate voltage $V_G$ approaches −5V is due to a gate leakage current ($I_G$), though this gate leakage current $I_G$ is small in comparison to a high-conductance, LRS current of the devices. Thus, the devices exhibit continuous states with simultaneous programming and reading. In embodiments, set rates could be improved through maximization of the field in the metal oxide 108 by minimization of the thickness of the metal oxide 108 and the thickness of the insulator layer 110 between the gate 106 and the metal oxide 108 (e.g., the gate insulator), or by using a high-k gate insulator. In other embodiments, set rates could be improved through modifications of the properties of the metal oxide 108 such as through doping, annealing, or different deposition conditions or by using a different metal oxide 108 than that of the fabricated structure 100C.

Figure 13A:
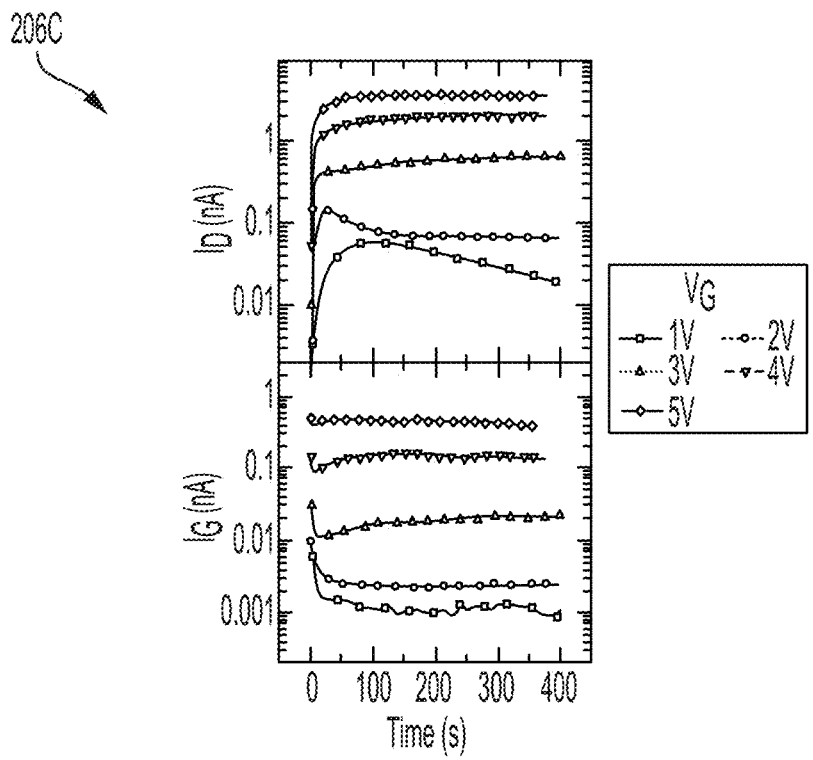
FIG. 13A is a graphical illustration of gate current and read current over time with a constant read voltage and different gate voltages for the transverse-gated 3T RRAM structure, according to one or more embodiments as shown and described herein.

FIG. 13A depicts a graph 206C of gate current $I_G$ (in a bottom plot) and read current $I_D$ (in a top plot) over time (in seconds) with a constant read voltage $V_D$ of 1V and different gate voltages $V_G$ from 1V to 5V for the fabricated structure 100C, which is characterized for power consumption and set/rest rates. The gate current $I_G$ may be representative of leakage current, current due to metal oxide polarization leading to a change in accumulation on the gate, or combinations thereof. The fabricated structure 100C reaches an LRS quickly in the read current $I_D$ curves and retains the state due to a persistent gate voltage $V_G$. For a low gate voltage $V_G$, the read current $I_D$ falls after reaching a peak, likely due to complex fields in the metal oxide 108 that remove oxygen vacancies ($V_O^{2+}$) from a top electrode region (e.g., the first electrode 102) due to a positive read voltage $V_D$ applied to the top electrode. As shown in the bottom plot of FIG. 13A a higher gate current $I_G$ is shown when the device is approaching an LRS, likely due to a polarization of the metal oxide 108. The gate current $I_G$ is shown to fall once the fabricated structure 100C reaches equilibrium, which baseline current is then representative of gate leakage. From the data of FIG. 13A, energy is calculated over a time taken to change one order of magnitude, as shown in TABLE 1 below.

TABLE 1

| $V_G$ (V) | 1 | 2 | 3 | 4 | 5 |
|---|---|---|---|---|---|
| Max. LRS (pS) | 55.8 | 141 | 659 | 1960 | 3560 |
| Set Time (s) | 26.9 | 5.33 | 4.79 | 3.72 | 1.68 |
| Set Energy (pJ) | 1.16 | 81.8 | 279 | 1480 | 3820 |

In TABLE 1, for different gate voltages $V_G$ of 1V to 5V, a maximum LRS, set times, and set energies for a 10×$I_D$ change from HRS with $V_D$=1V is shown, which corresponds to FIG. 13A. Corresponding reset measurement were taken for similar times and energies for a one order of magnitude (e.g., 10 times or 10×) change from LRS to measure, at a −5V gate voltage $V_G$, reset energy and time at 1920 pJ over 1.076 s.

Figure 13B:
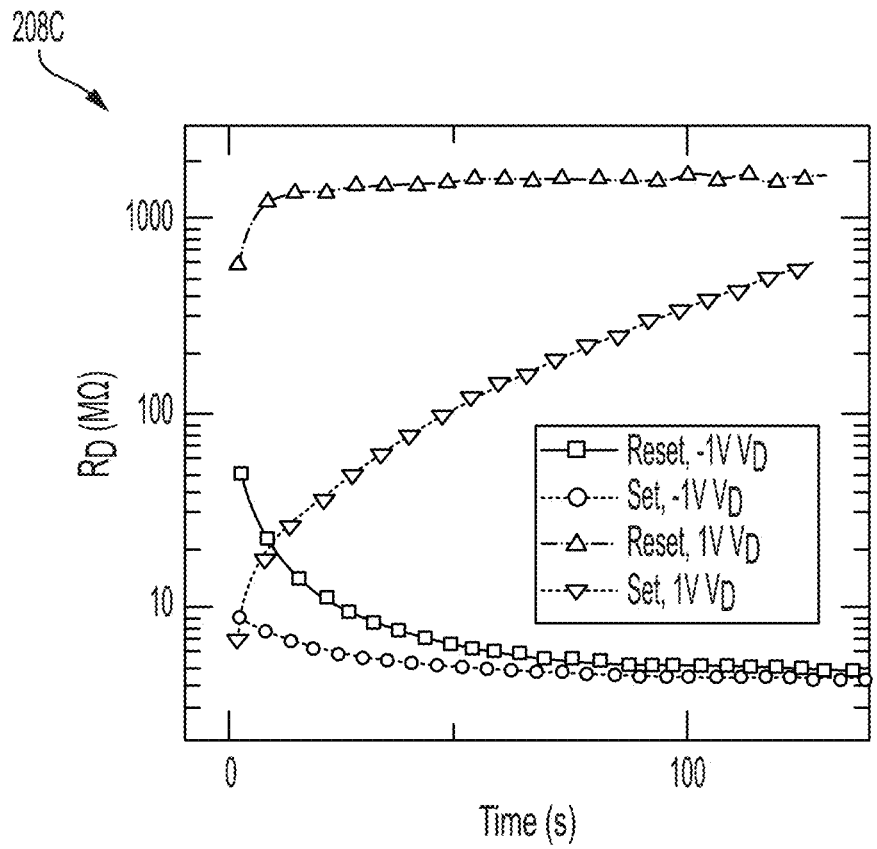
FIG. 13B is a graphical illustration of a state retention for a device including the transverse-gated 3T RRAM structure of FIG. 4, according to one or more embodiments as shown and described herein.

FIG. 13B depicts a graph 208C of a state retention for the fabricated structure 100C following a 5V, 500 ms pulse for configuring to LRS and a −5V, 500 ms pulse for configuring to HRS. Thus, FIG. 13B is directed to test results for state retention/decay of the fabricated structure 100C. After each pulse, the gate 106 was left open and the state was read over 140 seconds using a read current $V_D$ of −1V and +1V. FIG. 13B shows that a positive $V_D$ of +1V reinforces the HRS while a negative $V_D$ of +1V reinforces the LRS. Oxygen vacancies ($V_O^{2+}$) diffusion or oxygen vacancies ($V_O^{2+}$) drift may explain the state decay. Oxygen vacancies ($V_O^{2+}$) diffusion may naturally reset the fabricated structure 100C over time due to an induced oxygen vacancies ($V_O^{2+}$) concentration gradient. Oxygen vacancies ($V_O^{2+}$) drift may be due to an intrinsic field in the metal oxide 108 that is generated by polarizing the metal oxide 108 when programming the fabricated structure 100C. Additionally, a constant read current $V_D$ of +1V will pull oxygen ions ($O^{2−}$) back into the conduction path 114 to increase resistance (HRS) while a constant read current $V_D$ of −1V will push oxygen ions ($O^{2−}$) back from the conduction path 114 continuously to decrease resistance (LRS). In embodiment, reactive electrodes may be use instead of non-reactive electrode for one or both of the first electrode 102 and the second electrode 104 to prevent HRS decay based on applied negative read voltage $V_D$ or the metal oxide 108 used by have a higher oxygen ion ($O^{2−}$) activation energy.

Figure 13C:
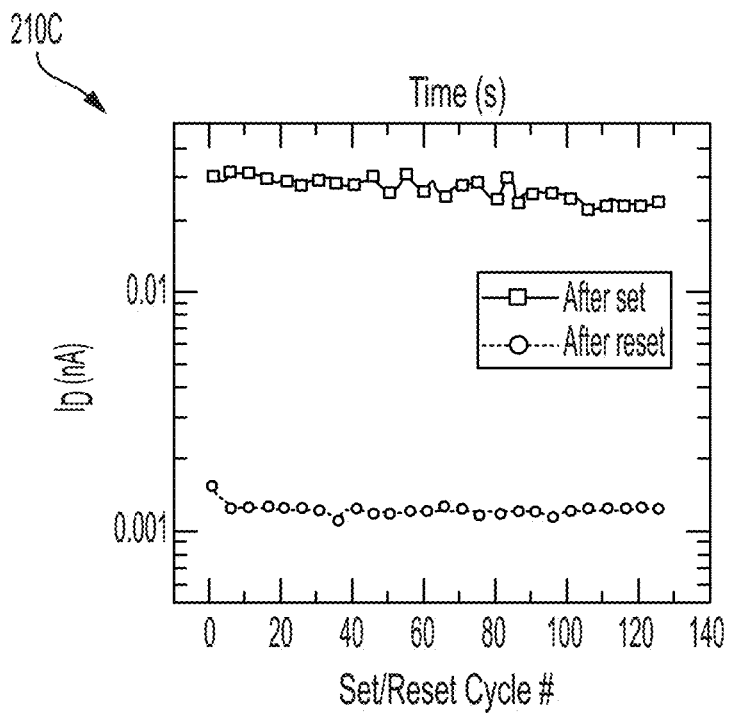
FIG. 13C is a graphical illustration of set and reset states using a 10V/−10V, 10 ms pulse to gate voltage respectively with a constant read voltage of 1V for a device including the transverse-gated 3T RRAM structure of FIG. 4, according to one or more embodiments as shown and described herein.

FIG. 13C illustrates endurance of the fabricated structure 100C and depicts a graph 210C of set and reset states over 128 cycles using a 10V/−10V, 10 ms pulse to gate voltage $V_G$ with a constant read voltage $V_D$ of 1V for the fabricated structure 100C. The repetitive setting and resetting with alternating +10V and −10V gate voltage $V_G$ at 100 ms pulses for 128 cycles with a state read with a read voltage $V_D$ of 1V shows endurance over the tested span. For example, little degradation of the fabricated structure 100C in the separation of states is shown over the span, and the fabricated structure 100C is able to reliably switch for the 128 cycles. It is to be understood that the +10V/−10V voltages for FIG. 13C utilized a SrTiO$_x$/SiN stack for the fabricated structure 100C. With engineering of this stack, switching voltages may be significantly reduced.

Figure 14A:
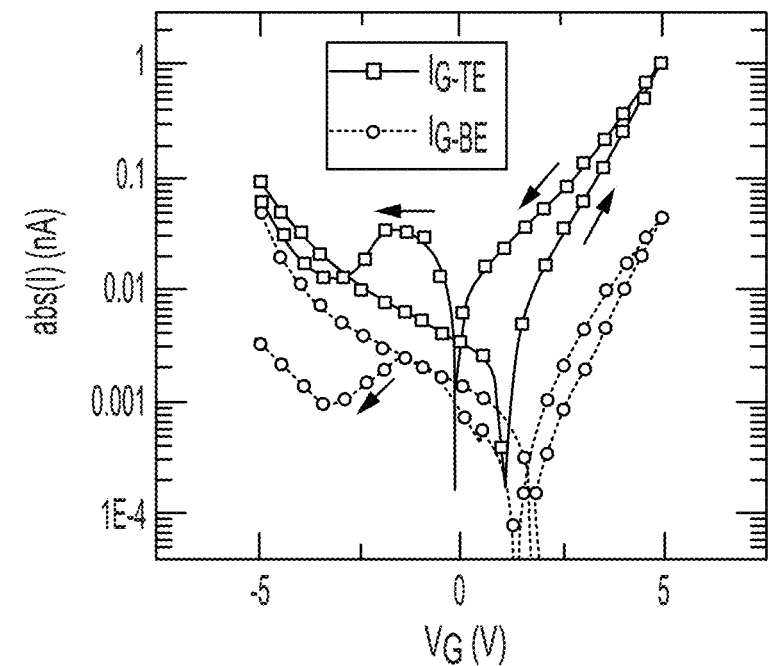
FIG. 14A is a graphical illustration of current representative of leakage current from a first terminal to a gate terminal and from a second terminal to the gate terminal with a swept gate voltage and the first and second terminals grounded for the transverse-gated 3T RRAM structure of FIG. 4, according to one or more embodiments as shown and described herein.

FIG. 14A illustrates an effect of read current $I_D$ and gate current $I_G$ on device state and depicts a graph 212C. The graph 212C illustrates a first gate to terminal current ($I_{G-TE}$) for current from the first electrode 102 (e.g., as a top electrode TE) to the gate 106. The graph 212C further illustrates a second gate to terminal current ($I_{G-BE}$) for current from the second electrode 104 (e.g., as a bottom electrode BE) to the gate 106. The first and second gate to terminal currents ($I_{G-TE}$ and $I_{G-BE}$) are shown based on a swept gate voltage $V_G$ between −5V and 5V and with the first and second terminals grounded for the fabricated structure 100C. The gate current $I_G$ of FIGS. 9 and 10 may be representative of gate leakage through the gate insulator (e.g., the insulator layer 110 between the gate 106 and the metal oxide 108) to the first electrode 102 and the second electrode 104. In embodiments, a thicker gate insulator may be used to minimize leakage as the gate current $I_G$. As shown in FIG. 14A, the gate current $I_G$ to the top electrode TE (as read current −$I_D$) is in a range of hundreds of picoamperes (pA), which is smaller than the read current $I_D$ for the fabricated structure 100C.

Figure 14B:
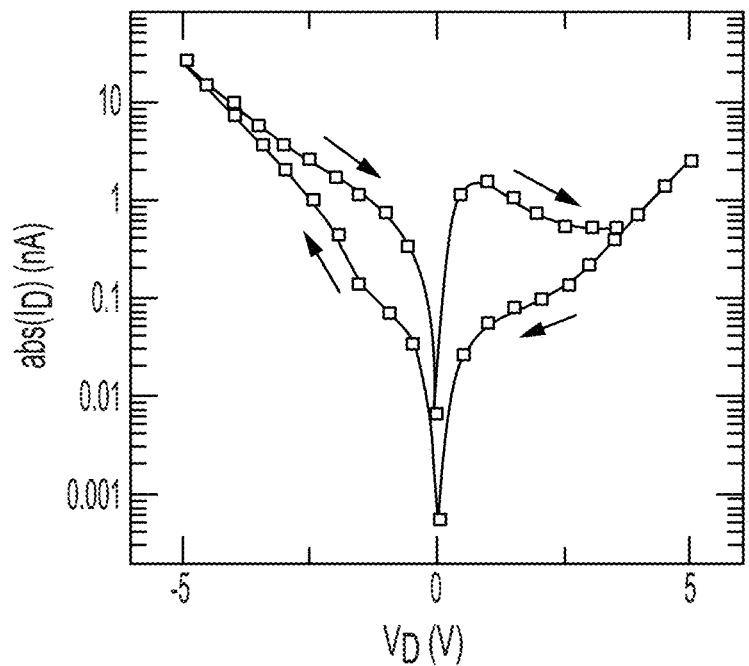
FIG. 14B is a graphical illustration of read current with read voltage swept and gate voltage at 0V for the transverse-gated 3T RRAM structure of FIG. 4, according to one or more embodiments as shown and described herein.

FIG. 14B illustrates a top electrode TE to bottom electrode BE conductance where the gate voltage $V_G$ is set to 0V. In particular, FIG. 14B depicts a graph 214C of read current $I_D$ with read voltage $V_D$ swept between −5V and 5V and a gate voltage of 0V for the fabricated structure 100C, which causes the fabricated structure 100C to act similarly to a 2T RRAM. Significant hysteresis is shown along with a change of conductance that is less than when the gate 106 is used to configure the fabricated structure 100C even though read voltage $V_D$ is similarly swept between −5V and 5V, which conductance change difference could be decreased with a reduced read voltage $V_D$.

Figure 15:
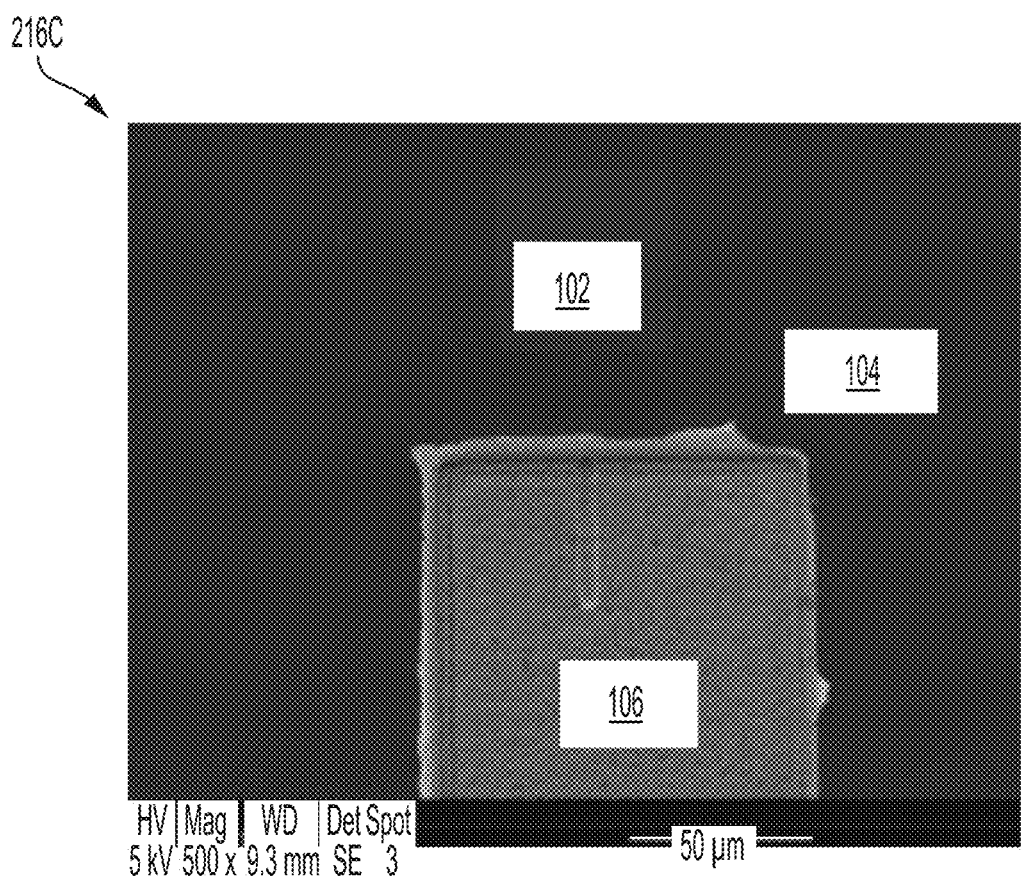
FIG. 15 is a scanning electron microscopy (SEM) image of a fabricated transverse-gated 3T RRAM structure of FIG. 4, according to one or more embodiments as shown and described herein.

FIG. 15 is a scanning electron microscopy (SEM) image 216C of a top view of a fabricated structure 100C embodiment including a 5 μm channel width, while the data of FIGS. 11A-14B is from a tested fabricated structure 100C including a 100 μm channel width. The tested fabricated structures 100C were measured in a Cascade Microtech MPS150 probe station using a Keithley 4200 Semiconductor Characterization System and fitted with a 4225 Pulse Modulation Unit. The testing results shown in FIGS. 11A-14B show that the fabricated structure 100C exhibits continuous conductance states over three orders of magnitude that are controllable with a 5V gate voltage $V_G$. Further, reading of the fabricated structure 100C is able to occur independently of programming through the gate voltage $V_G$ to allow for many-state memory as the resistance state is easily tunable, which is useful for neuromorphic architectures. The conduction path 114 (e.g., active area) of the fabricated structure 100C may be 3 μm wide with a 20 nm terminal separation between the first electrode 102 and the second electrode 104. In embodiments, an interface width may be in a range from about 3 μm to about 100 μm. As a non-limiting embodiment, the fabricated structure 100C may include a 5 μm channel depth and be a 100 μm device. A vertical terminal separation may be 20 nm with a 40 nm electrode height such that a cross-sectional contact from an electrode to the metal oxide 108 is 40 nm×100 μm=4 μm$^2$. It should be contemplated and is within the scope of this disclosure that the devices described herein are not limited to the above-referenced dimensions and may be scaled down to sub-micron and deep sub-micron widths.

In non-limiting embodiments, to fabricate one or more fabricated structures 100C as a method of fabricating a non-volatile multi-terminal RRAM device, an amount of material for the second electrode 104, an amount of material for a first insulator layer 110, and an amount of material for the first electrode 102 may be sequentially deposited onto an semiconductor substrate material through a deposition technique, such as through use of radio frequency (RF) magnetron sputtering. Using a removal technique for a first removal processing, such as photolithography and/or etching, one or more top layers may be removed over most of the wafer, where the protected top layer of the first electrode 102 is designated as the top electrode TE. The underlying exposed layer of the second electrode 102 may be designated the bottom electrode BE. A second removal processing on an edge of the TE region may expose the underlying semiconductor substrate material. Further, an amount of material for the metal oxide 108, an amount of material for an insulator layer 110 as the gate insulator or gate insulator layer, and an amount of material for the gate 106 may be sequentially deposited through a deposition technique, such as through use of RF magnetron sputtering. These deposited layers may be thickened to ensure sufficient sidewall deposition, and an area outside of an etched region may be removed using a photoresist liftoff or etch process. The sidewall of the etched region is the conduction path 114 as the active area. It should be understand and is contemplated within the scope of this disclosure that other methods of fabrication of the multi-terminal RRAM devices described herein are possible, such as through use of <100 nm-level lithography.

In embodiments, fabrication of the devices 100 described herein using <100 nm-level lithography may permit fabrication of the devices 100 in the shown orientations or, alternatively, in different orientations. For example, through <100 nm-level lithography, the devices 100C-100F may be rotated by 90 degrees and fabricated as planar devices. The <100 nm-level lithography method may remove a side-wall deposition step and achieves a <100 nm layer precision for a channel oxide thickness between the first and second electrodes 102, 104 and the gate 106. The devices 100 may then be fabricated by sequentially depositing, patterning, and etching each device layer. For example, the device 100C of FIG. 4A may be fabricated as a planar device 100C' of FIG. 4B through first depositing the first electrode 102 on an insulating substrate 112, which maybe a Si/SiOx substrate. The first electrode 102 may then be patterned and etched. It is to be understood that if the materials of the first electrode 102 and the second electrode 104 are the same, then both the first electrode 102 and the second electrode 104 may be deposited, patterned, and etched simultaneously. If the first electrode 102 is first deposited, patterned, and etched, the insulator layer 110, which may be made of $Si_3N_4$, for example, is deposited, and a second pattern is applied to mask the first electrode 102 and insulator layer 110 layers. Next, the second electrode 104 may be deposited, patterned, and etched. Following, the metal oxide 108, the gate insulator 110, and the gate 106 may be sequentially deposited on top and etched to finish the structure. A similar process may be employed for each device 100C-100F described herein to achieve planar structures for each respective device if permitted by a lithography minimum feature size.

In a non-limiting embodiment, the method of fabricating a non-volatile multi-terminal RRAM device may include sequentially depositing an amount of material for the second electrode 104, an amount of material for a first insulator layer 100, and an amount of material for the first electrode 102 onto a semiconductor substrate material through a deposition technique to form a wafer, applying a removal technique to remove one or more top layers from the wafer, wherein a protected top layer of the first electrode 102 comprises a top electrode and an underlying exposed layer of the second electrode 104 comprises a bottom electrode. The method may further include applying the removal technique on an edge of the top electrode to expose underlying semiconductor substrate material and define an etched region on a sidewall of the wafer, sequentially depositing an amount of material for the metal oxide 108, an amount of material for a gate insulator layer 110, and an amount of material for the gate 106 through the deposition technique, and applying the removal technique to an area outside of the etched region such that a sidewall of the etched region is designated as an active area for the conduction path 114 of the non-volatile multi-terminal RRAM device 100. In embodiments, the deposition technique comprises RF magnetron sputtering, and the removal technique comprises photolithography, etching, photoresist liftoff, or combinations thereof.

As a non-limiting example, 50 nm of TiN for the second electrode 104, 20 nm of $Si_3N_4$ for an insulator layer 110, and 40 nm of TiN for the first electrode 102 may be sequentially deposited onto an oxidized 4-inch p-Si substrate using RF magnetron sputtering. Further, using photolithography and reactive ion etching with CF4/O2 plasma, the top two layers may be removed over most of the wafer such that a remaining protected top layer of TiN is the top electrode TE and the underlying exposed TiN layer is the bottom electrode BE. A second aligned photolithography and subsequent reactive ion etching on an edge of the TE region exposes the silicon substrate. Further, 40 nm of $SrTiO_3$, 20 nm of $Si_3N_4$, and 40 nm of W may be sequentially deposited using RF magnetron sputtering. An area outside of the etched region may be removed using a photoresist liftoff, and a sidewall of the etched region may be designated an active area for the conduction path 114. The W region defines the gate 106 of the fabricated device 100.

As an example, and not as a limitation, the transverse or side-gated multi-terminal RRAM devices 100 described herein may include higher endurance and lower switching energy compared to other NVM technologies. For example, NAND Flash Memory operates (e.g. to store data as memory) based off a charge trap of a floating gate, phase change memory (PCM) operates based off a phase change of a special glass (GST) within a bit cell, spin-transfer torque random-access memory (STTRAM) operates based off magnetization with programming current passing through a magnet rather than write lines adjacent a bit, 2T RRAM operates based off filament redox as described herein, and multi-terminal RRAM operates based off gated filament as described herein.

Thus, The gated RRAM structure 100 provides high endurance and low switching energy compared to the other NVM devices, which other NVM devices have difficulty achieving multiple definitive resistive states as required for AI and neuromorphic computing. The multi-terminal RRAM device 100 described herein, by contrast, is a gated, reconfigurable, tunable device able to easily achieve multiple resistive states.

With respect to hard disk drives (HDD) as other NVM data storage technologies, such HDD devices cannot be integrated on-chip, consume massive power, and are comparatively slow to the multi-terminal RRAM devices 100 described herein. With respect to flash memory devices, such flash memory devices suffer from limited endurance. PCM, STTRAM, and 2T RRAM devices suffer from issues of high write current and sneak current when integrated in high-density crossbar arrays. Separately, 2T RRAM is subject to variability and yield issues, PCM is subject to thermal crosstalk issues, and STTRAM is subject to limited scalability and thermal-noise induced bit-flips. The multi-terminal RRAM devices 100 described herein further provides for a highly-scalable and energy-efficient NVM device technology able to be integrated on-chip or for used for off-chip data storage as well with AI, DNN, Internet-of-things (IOT), and neuromorphic, and like applications.

Referring again to FIG. 8, the side-gated multi-terminal RRAM structure 100F may have applied signals as shown. As a non-limiting embodiment, a read voltage $V_{read}$ (e.g., read voltage $V_D$) biases the first electrode 102 as a top electrode TE, a programming write voltage $V_{write}$ (e.g., gate voltage $V_G$) biases the gate 106, and the second electrode 104 as a bottom electrode BE is grounded.

Figure 16:
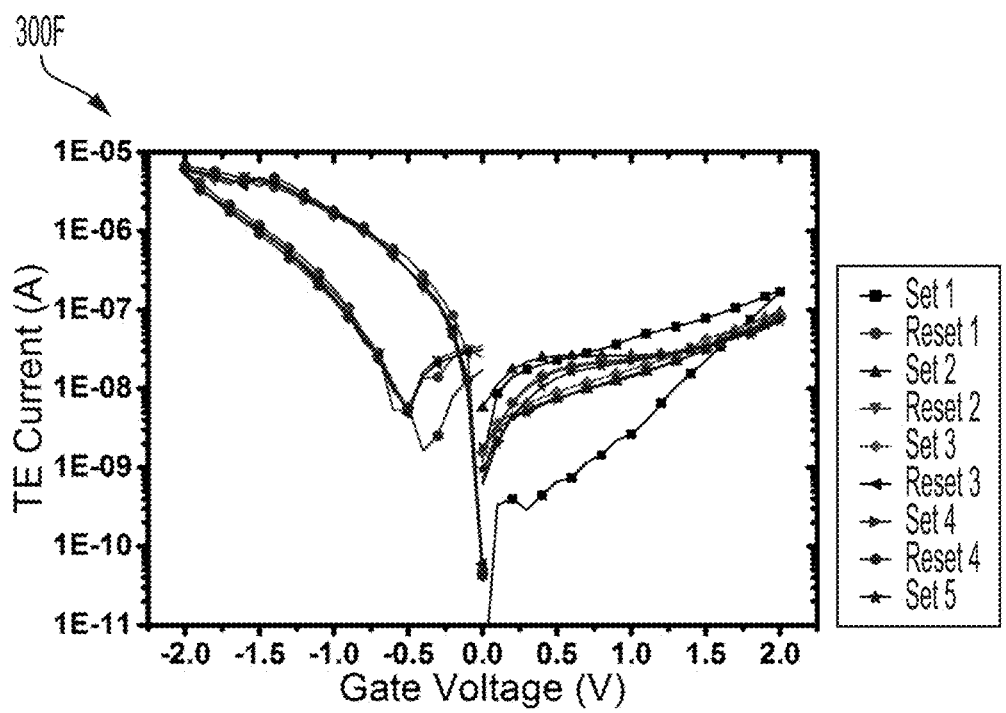
FIG. 16 is a graphical illustration of set and reset behavior of the side-gated multi-terminal RRAM structure of FIG. 8, according to one or more embodiments as shown and described herein.

FIG. 16 illustrates that biasing the device of FIG. 8 from the gate 106 to the second electrode 104 can induce a memristive set/reset behavior of the side-gated multi-terminal RRAM structure 100F. A graph 300F of FIG. 16 shows this set and reset behavior of the side-gated multi-terminal RRAM structure 100F of FIG. 8. This set/reset behavior is similar to a 2T RRAM behavior and allows for existence of continuous analog conductive states between an LRS and an HRS in the conduction path 114.

Figure 17:
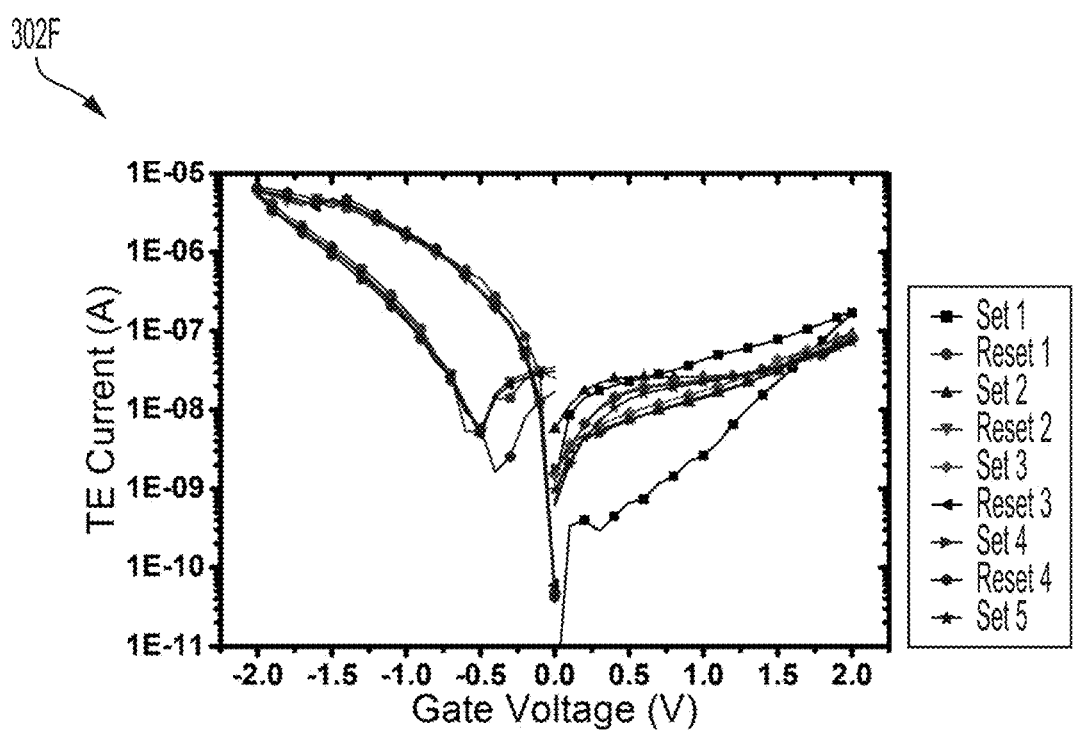
FIG. 17 is a graphical illustrate of device potentiation using voltage sweeps for the side-gated multi-terminal RRAM structure of FIG. 8, according to one or more embodiments as shown and described herein.

FIG. 17 shows voltage dependence and depression characteristics for the side-gated multi-terminal RRAM structure 100F of FIG. 8. A graph 302F of FIG. 17 shows device potentiation in terms of current (measured in amperes A) using voltage sweeps ranging from 2V to 6V of a device 100 and shows that devices can potentiate up to four orders of magnitude from a starting state. It should be understood and is contemplated within the scope of this disclosure that the voltages shown may be reduced through further engineering of the stacks of the multi-terminal RRAM devices described herein.

Figure 18:
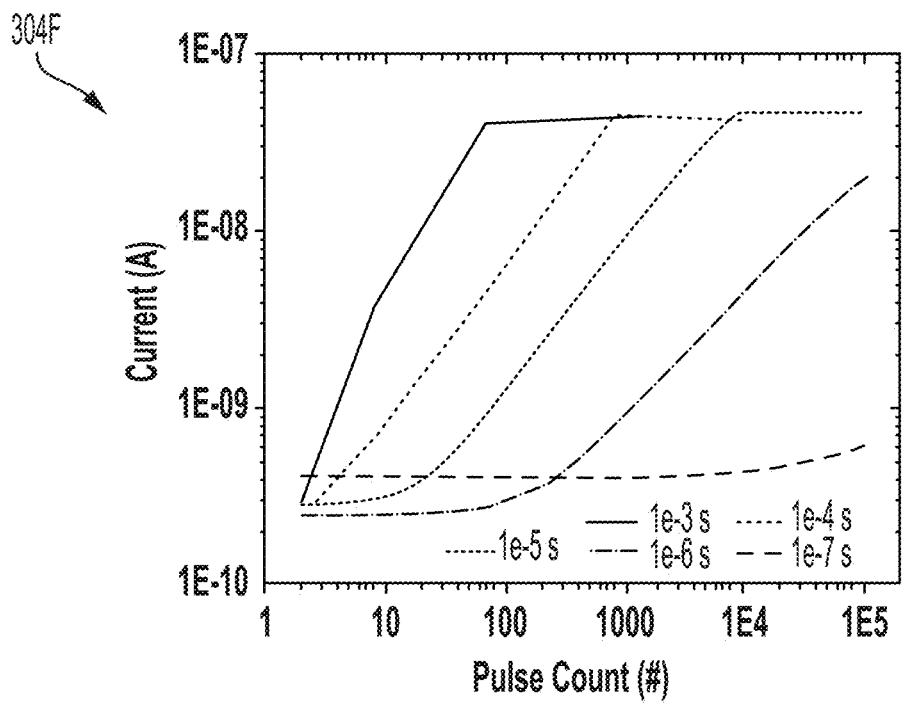
FIG. 18 is a graphical illustration of device potentiation for different pulses and a 3V gate voltage for the side-gated multi-terminal RRAM structure of FIG. 8, according to one or more embodiments as shown and described herein.

FIG. 18 shows a temporal dependence of the potentiation of the side-gated multi-terminal RRAM structure 100F of FIG. 8 as a function of sweep voltage (e.g., a gate voltage $V_G$). A graph 304F of FIG. 18 shows device potentiation for different pulses of 1e−3 s, 1e−4 s, 1e−5 s, 1e−6 s, and 1e−7 s, and using 3V gate voltage $V_G$ pulses for the side-gated multi-terminal RRAM structure 100F.

Figure 19:
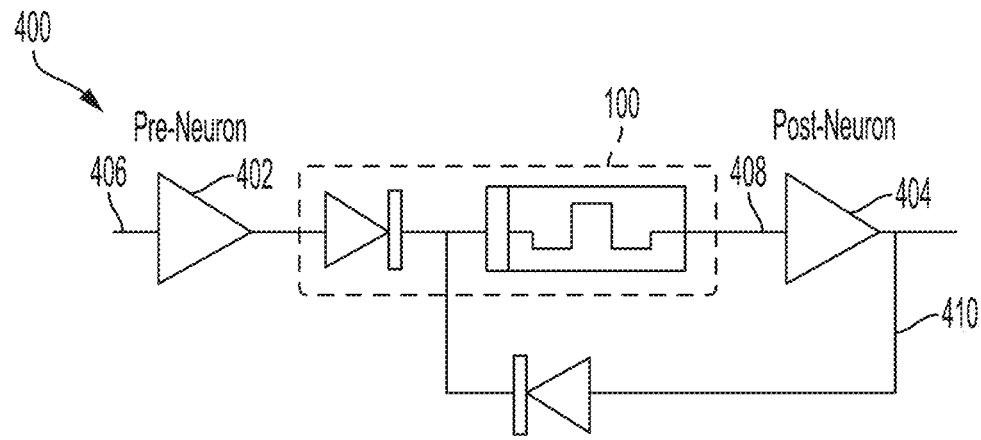
FIG. 19 is a schematic illustration of a 3T RRAM device integration in a crossbar architecture, according to one or more embodiments as shown and described herein.
Figure 20:
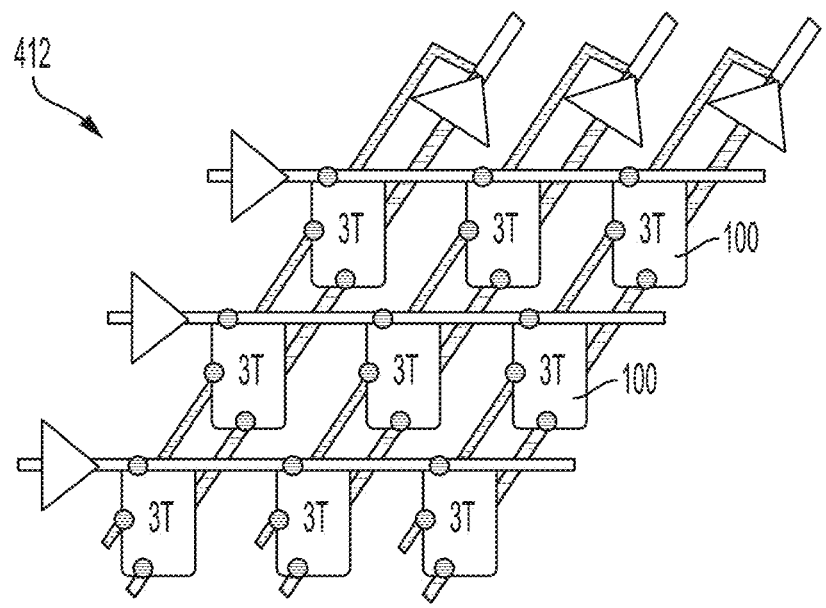
FIG. 20 is a schematic illustration of a cross bar array integration of a 3T RRAM device package based on the 3T RRAM devices of FIG. 19, according to one or more embodiments as shown and described herein.

FIG. 19 depicts a crossbar architecture 400 integrated with a multi-terminal RRAM device 100, such as a side-gated or transverse-gated 3T RRAM device 100F, 100C. As a non-limiting example, for the 3T RRAM device 100F with a side-gate as the gate 106, a top electrode as the first electrode 102 may be utilized as a read terminal for the 3T RRAM device 100. In the crossbar architecture 400, the top electrode is attached to an input bar 406 (e.g., for output from each pre-neuron device 402), a bottom electrode as the second electrode 102 is attached to an output bar 408 (e.g., for input into each post-neuron device 404), and a side-gate 106 is attached to an output 410 of the post-neuron device 404.

In an embodiment, a method of integrating one or more non-volatile multi-terminal RRAM devices 100 into a crossbar array for a neuromorphic application may include positioning at least one non-volatile multi-terminal RRAM device 100 as a crosspoint device between the input bar 406 and the output bar 408 of the crossbar array, wherein at least one non-volatile multi-terminal RRAM device 100 comprises a top electrode (e.g., the first electrode 102), a bottom electrode (e.g., the second electrode 104), the metal oxide 108 defining the conduction path 114 disposed therebetween, and at least the first gate 106 configured to apply a voltage bias to change a resistive state based on movement of oxygen ions in the conduction path 114 to switch the resistive state between the first electrode 102 and the second electrode 104 between a low resistance state (LRS) and a high resistance state (HRS). The method may further include integrating the pre-neuron device 402 into the input bar 406 of the crossbar array and integrating the post-neuron device 404 into the output bar 408 of the crossbar array. The resistance state of the at least one non-volatile multi-terminal RRAM device is configured affect behavior of post-neuron device 404.

The method may further include utilizing the top electrode as a read terminal to which is a read voltage $V_D$ is applied from the input bar 406 of the crossbar array, where the top electrode is attached to the input bar 406 to receive output from the pre-neuron device 402 and the bottom electrode is attached to the output bar 408 to transmit input into the post-neuron device 404. Further, the first gate 106 is attached to a feedback bar of the crossbar array and configured to receive the output 410 of the post-neuron device 404.

As a non-limiting example, FIG. 20 depicts a crossbar array 412 integrated with a 3T RRAM device package based on the 3T RRAM devices 100 of FIG. 19. The 3T RRAM devices 100 act as a cross point device between input and output bars of the crossbar array 412. For neuromorphic applications, neuron devices are integrated into the inputs and outputs of the crossbar array 412 to allow for a dot-product of resistance states of a 3T RRAM device 100 to affect output neuron behavior. While integration into a crossbar may occur for the multi-terminal RRAM device 100 as described herein, each multi-terminal RRAM device 100 may utilize a different I/O pattern and material choices. In embodiments, crossbar arrays 412 may be printed in a 32×32 array.

In embodiments, the multi-terminal RRAM devices 100 described herein may be prepared as standalone multi-terminal memory arrays packaged as a module for developing neuromorphic hardware modules. The crossbar arrays 412 may be packaged and integrated together into standalone parts compatible with other technologies, such as CMOS architectures, for applications such as small sized, robust inferencing platforms in areas such as a robotic sensing or internet-of-things (IOT) integration.

The multi-terminal RRAM devices 100 described herein provide high endurance and low switching energy and are gated, reconfigurable, tunable devices able to easily achieve multiple resistive states for applications such as AI, neuromorphic, and the like emerging technologies. Further, the multi-terminal RRAM devices 100 described herein provides for a highly-scalable and energy-efficient NVM device technology able to be integrated on-chip or for used for off-chip data storage as well with AI, DNN, internet-of-things (JOT), and neuromorphic, and like emerging computing technologies.

For example, with such emerging computing technologies, systems including one or more memory devices communicatively coupled to one or more processors may be configured or programmed to execute one or more machine readable instructions stored in the memory devices. As used herein, the term "communicatively coupled" means that coupled components are capable of exchanging data signals with one another such as, for example, electrical signals via conductive medium, electromagnetic signals via air, optical signals via optical waveguides, and the like. Modules of such systems may be configured to use a neural network that, in a field of machine learning, for example, may a class of deep, feed-forward artificial neural networks for artificial intelligence applications. As an example, and not a limitation, artificial intelligence features of such systems may include components selected from the group consisting of an artificial intelligence engine, Bayesian inference engine, and a decision-making engine, and may have an adaptive learning engine further comprising a deep neural network learning engine. Such systems may implement computer and software-based methods and include a communication path for communicatively coupling system modules, the one or more processors (that may be may be a controller, an integrated circuit, a microchip, a computer, or any other computing device), the one or more memory devices, one or more databases, network interface hardware, a network, one or more servers, and one or more computing devices. The systems can comprise multiple application servers and workstations. In some embodiments, the systems are implemented using a local area network (LAN), a wide area network (WAN), or other network, such as an intranet or the Internet. The systems may use the memory devices 100 described herein alongside one or more alternative memory devices, such as volatile or non-volatile memory that may comprise random access memory (RAM), read only memory (ROM), flash memories, hard drives, or any device capable of storing machine-readable instructions such that the machine-readable instructions can be accessed and executed by the one or more processors. The machine-readable instructions may comprise logic or algorithm(s) written in any programming language such as, for example, machine language that may be directly executed by the one or more processors, or assembly language, object-oriented programming (OOP), scripting languages, microcode, etc., that may be compiled or assembled into machine-readable instructions and stored on the memory devices. Alternatively, the machine-readable instructions may be written in a hardware description language (HDL), such as logic implemented via either a field-programmable gate array (FPGA) configuration or an application-specific integrated circuit (ASIC), or their equivalents.

Data stored and manipulated in the systems described herein is utilized by the system modules that are able to leverage the network, such as a cloud computing-based network configuration (e.g., the cloud) or other network variations, to apply machine learning and artificial intelligence. This machine learning application may create models that can be applied by the system to make it more efficient and intelligent in execution. The network can comprise any wired and/or wireless network such as, for example, local area networks, wide area networks, metropolitan area networks, the Internet, an Intranet, satellite networks, or the like. Accordingly, the network can be utilized as a wireless access point by a computing device to access one or more servers that generally comprise processors, memory, and chipset for delivering resources via the network. Resources can include providing, for example, processing, storage, software, and information from the server to the system via the network. Additionally, the server(s) can share resources with one another over the network such as, for example, via the wired portion of the network, the wireless portion of the network, or combinations thereof.

For the purposes of describing and defining the present disclosure, it is noted that reference herein to a variable being a "function" of a parameter or another variable is not intended to denote that the variable is exclusively a function of the listed parameter or variable. Rather, reference herein to a variable that is a "function" of a listed parameter is intended to be open ended such that the variable may be a function of a single parameter or a plurality of parameters.

It is also noted that recitations herein of "at least one" component, element, etc., should not be used to create an inference that the alternative use of the articles "a" or "an" should be limited to a single component, element, etc.

It is noted that recitations herein of a component of the present disclosure being "configured" or "programmed" in a particular way, to embody a particular property, or to function in a particular manner, are structural recitations, as opposed to recitations of intended use. More specifically, the references herein to the manner in which a component is "configured" or "programmed" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed disclosure or to imply that certain features are critical, essential, or even important to the structure or function of the claimed disclosure. Rather, these terms are merely intended to identify particular aspects of an embodiment of the present disclosure or to emphasize alternative or additional features that may or may not be utilized in a particular embodiment of the present disclosure.

For the purposes of describing and defining the present disclosure it is noted that the terms "substantially" and "approximately" and "about" are utilized herein to represent the inherent degree of uncertainty that may be attributed to any quantitative comparison, value, measurement, or other representation. The terms "substantially" and "approximately" and "about" are also utilized herein to represent the degree by which a quantitative representation may vary from a stated reference without resulting in a change in the basic function of the subject matter at issue.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Further, it will be apparent that modifications and variations are possible without departing from the scope of the present disclosure, including, but not limited to, embodiments defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present disclosure, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A method of switching a resistive state in a non-volatile multi-terminal resistive random access memory (RRAM) device, the method comprising:
    applying a voltage bias with an at least first gate of the non-volatile multi-terminal RRAM device, the non-volatile multi-terminal RRAM device further including a first electrode, a second electrode, and a metal oxide defining a conduction path positioned between the first electrode and the second electrode; and
    based on a polarity of the voltage bias applied, switching the resistive state in the conductance path between a low resistance state (LRS) and a high resistance state (HRS) in the conduction path.

2. The method of claim 1, wherein the voltage bias is applied as a gate voltage at the at least first gate in a write operation, and a read voltage is applied to one of the first electrode and the second electrode in a simultaneous read operation, and the other of the first electrode and the second electrode is grounded.

3. The method of claim 1, wherein when the polarity of the voltage bias applied is positive, applying the voltage bias as a positive gate voltage to one of the first electrode and the second electrode;
    attracting negatively-charged oxygen ions ($O^{2-}$) to the at least first gate and away from the conduction path of the metal oxide; and
    setting the conduction path such that increased oxygen vacancies ($V_O^{2+}$) in the conduction path define the LRS and permit conductance in the conduction path.

4. The method of claim 1, wherein when the polarity of the voltage bias applied is negative, applying the voltage bias as a negative gate voltage to one of the first electrode and the second electrode;
    repelling negatively-charged oxygen ions ($O^{2-}$) away from the at least first gate and toward the conduction path of the metal oxide; and
    resetting the conduction path such that the negatively-charged oxygen ions ($O^{2-}$) recombine with and reduce oxygen vacancies ($V_O^{2+}$) in the conduction path to define the HRS and break conductance in the conduction path.

5. The method of claim 1, wherein a longitudinal axis of the first electrode is positioned parallel to a longitudinal axis of the second electrode and a longitudinal axis of the conduction path of the metal oxide is positioned transverse to the longitudinal axis of the first electrode and the longitudinal axis of the second electrode.

6. The method of claim 5, wherein a longitudinal axis of the at least first gate is positioned transverse to the longitudinal axis of the first electrode and the longitudinal axis of the second electrode.

7. The method of claim 5, wherein a longitudinal axis of the at least first gate is positioned parallel to the longitudinal axis of the first electrode and the longitudinal axis of the second electrode.

8. The method of claim 1, wherein at least one of the first electrode or the second electrode comprises:
    a non-reactive oxidation-resistant metal or semi-metal material that is TiN, TaN, Ru, Pt, or Au; or
    a reactive oxidizable metal or semi-metal material that is Ti, Ta, W, Al, Zr, Hf, or Mg.

9. The method of claim 1, wherein:
    the at least first gate comprises one of TiN, TaN, W, Ti, Al, Ta, Cu, or a non-stochiometric ionic oxide; and
    the metal oxide comprises a switching oxide of a general transition metal oxide form $MO_Z$ comprising $SrTiO_3$, $HfO_x$, $TaO_x$, $NbO_x$, $MgO$, $ZrO_2$, $TiO_2$, doped versions of the $MO_Z$ materials, other transition metal oxides with ionizable oxygen, or combinations thereof.

10. The method of claim 1, further comprising one or more insulator layers disposed between the first electrode and the second electrode, the metal oxide and the at least first gate, or combinations thereof.

11. The method of claim 1, further comprising:
    an insulating substrate comprising $SiO_2$ or SiN;
    an additional substrate comprising Si separated from the metal oxide by the insulating substrate, and
    one or more insulator layers disposed between the first electrode and the second electrode, the metal oxide and the at least first gate, the semiconductor substrate and the second electrode, or combinations thereof, wherein at least one of the one or more insulator layers comprises $Si_3N_4$ or $SiO_2$.

12. A method of integrating one or more non-volatile multi-terminal resistive random access memory (RRAM) devices into a crossbar array for a neuromorphic application, the method comprising:
    positioning at least one non-volatile multi-terminal RRAM device as a crosspoint device between an input bar and an output bar of the crossbar array, wherein at least one non-volatile multi-terminal RRAM device comprises a top electrode, a bottom electrode, a metal oxide defining a conduction path disposed therebetween, and an at least first gate configured to apply a voltage bias to change a resistive state based on movement of oxygen ions in the conduction path to switch the resistive state between the first electrode and the second electrode between a low resistance state (LRS) and a high resistance state (HRS);
    integrating a pre-neuron device into the input bar of the crossbar array; and
    integrating a post-neuron device into the output bar of the crossbar array, wherein the resistance state of the at least one non-volatile multi-terminal RRAM device is configured to affect behavior of post-neuron device.

13. The method of claim 12, further comprising:
    applying a voltage bias with the at least first gate of the at least one non-volatile multi-terminal RRAM device; and
    based on a polarity of the voltage bias applied, switching the resistive state in the conductance path between a low resistance state (LRS) and a high resistance state (HRS) in the conduction path.

14. The method of claim 12, further comprising utilizing the top electrode as a read terminal to which is a read voltage is applied from the input bar of the crossbar array.

15. The method of claim 12, wherein the top electrode is attached to the input bar to receive output from the pre-neuron device.

16. The method of claim 12, wherein the bottom electrode is attached to the output bar to transmit input into the post-neuron device.

17. The method of claim 12, wherein the at least first gate is attached to a feedback bar of the crossbar array and configured to receive an output of the post-neuron device.

18. A method of fabricating a non-volatile multi-terminal resistive random access memory (RRAM) device, the method comprising:
   sequentially depositing an amount of material for a second electrode, an amount of material for a first insulator layer, and an amount of material for a first electrode onto a semiconductor substrate material through a deposition technique to form a wafer;
   applying a removal technique to remove one or more top layers from the wafer, wherein a protected top layer of the first electrode comprises a top electrode and an underlying exposed layer of the second electrode comprises a bottom electrode;
   applying the removal technique on an edge of the top electrode to expose underlying semiconductor substrate material and define an etched region on a sidewall of the wafer;
   sequentially depositing an amount of material for a metal oxide, an amount of material for a gate insulator layer, and an amount of material for a gate for the non-volatile multi-terminal RRAM device through the deposition technique; and
   applying the removal technique to an area outside of the etched region such that a sidewall of the etched region is designated as an active area for a conduction path of the non-volatile multi-terminal RRAM device.

19. The method of claim 18, wherein the deposition technique comprises radio frequency (RF) magnetron sputtering.

20. The method of claim 18, herein the removal technique comprises photolithography, etching, photoresist liftoff, or combinations thereof.

* * * * *